(12) United States Patent
Yu et al.

(10) Patent No.: US 11,244,879 B2
(45) Date of Patent: Feb. 8, 2022

(54) SEMICONDUCTOR PACKAGE

(71) Applicant: Taiwan Semiconductor Manufacturing Co., Ltd., Hsinchu (TW)

(72) Inventors: Chi-Yang Yu, Taoyuan (TW); Chien-Hsun Lee, Hsin-chu County (TW); Jung-Wei Cheng, Hsinchu (TW); Tsung-Ding Wang, Tainan (TW); Yu-Min Liang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 16/746,976

(22) Filed: Jan. 20, 2020

(65) Prior Publication Data
US 2021/0098325 A1 Apr. 1, 2021

Related U.S. Application Data

(60) Provisional application No. 62/906,707, filed on Sep. 26, 2019.

(51) Int. Cl.
*H01L 23/31* (2006.01)
*H01L 23/522* (2006.01)

(52) U.S. Cl.
CPC ...... *H01L 23/3121* (2013.01); *H01L 23/5226* (2013.01)

(58) Field of Classification Search
CPC ... H01L 24/19; H01L 21/6835; H01L 21/568; H01L 23/5389; H01L 23/5383; H01L 23/3121; H01L 23/5226
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2016/0343695 A1* | 11/2016 | Lin | H01L 21/565 |
| 2017/0103951 A1* | 4/2017 | Lee | H01L 23/295 |
| 2018/0138101 A1* | 5/2018 | Yu | H01L 23/3114 |
| 2018/0138151 A1* | 5/2018 | Shih | H01L 24/81 |

(Continued)

*Primary Examiner* — Zandra V Smith
*Assistant Examiner* — John M Parker
(74) *Attorney, Agent, or Firm* — JCIPRNET

(57) ABSTRACT

A semiconductor package including a first semiconductor device, a second semiconductor device, an insulating encapsulant, a redistribution structure and a supporting element is provided. The insulating encapsulant encapsulates the first semiconductor device and the second semiconductor device. The redistribution structure is over the first semiconductor device, the second semiconductor device and the insulating encapsulant. The redistribution structure is electrically connected to the first semiconductor device and the second semiconductor device. The supporting element is embedded in one of the insulating encapsulant and the redistribution structure.

20 Claims, 27 Drawing Sheets

(56) References Cited

U.S. PATENT DOCUMENTS

| | | | |
|---|---|---|---|
| 2019/0096825 A1* | 3/2019 | Kim | H01L 21/6835 |
| 2020/0365525 A1* | 11/2020 | Wu | H01L 21/486 |
| 2021/0125885 A1* | 4/2021 | Chen | H01L 23/3135 |
| 2021/0151370 A1* | 5/2021 | Choi | H01L 23/3128 |

\* cited by examiner

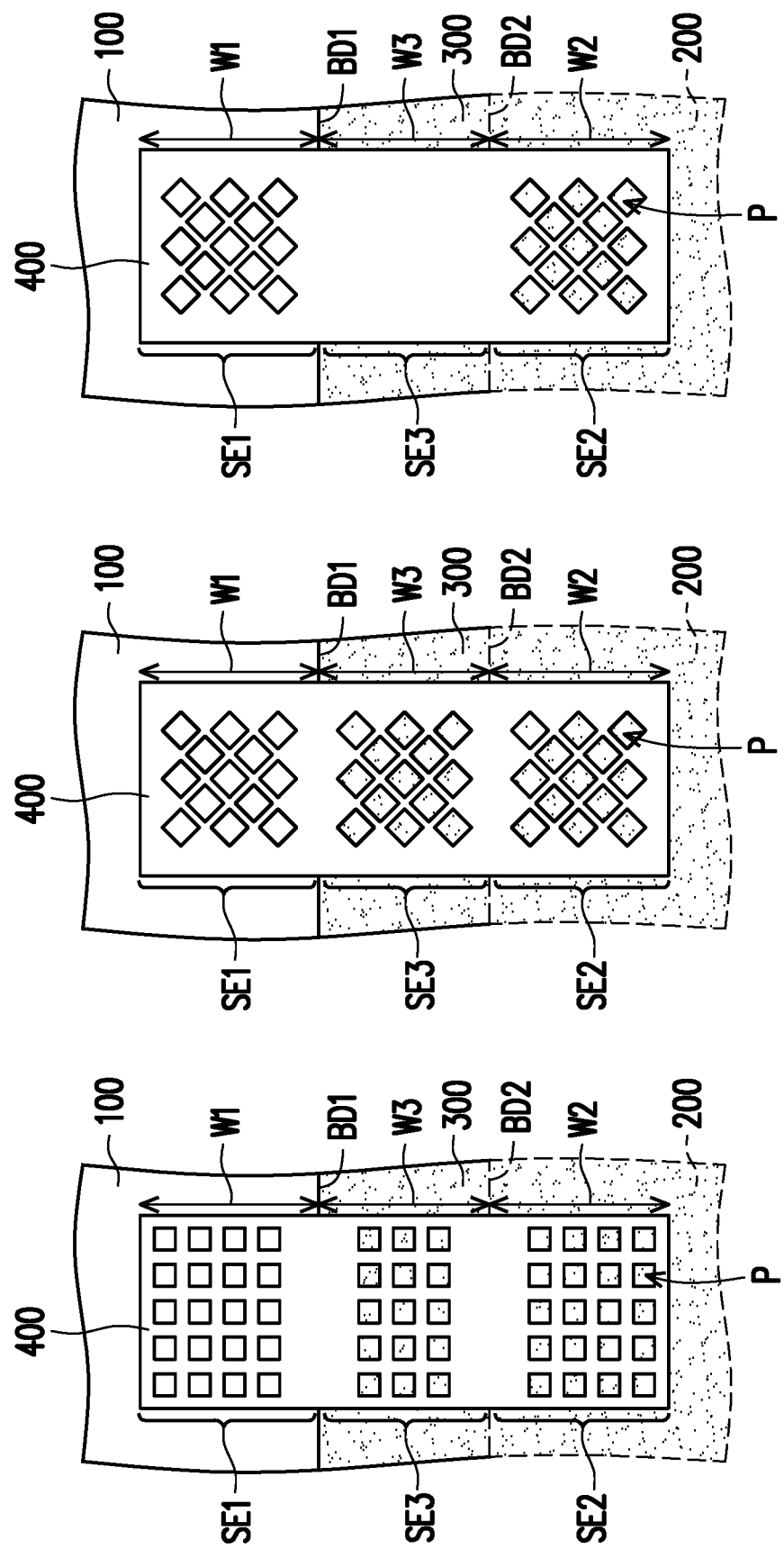

SEMICONDUCTOR PACKAGE

CROSS-REFERENCE TO RELATED APPLICATION

This application claims the priority benefit of U.S. provisional application Ser. No. 62/906,707, filed on Sep. 26, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the reliability of the redistribution circuit structure fabricated on the semiconductor die is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to FIG. 7C illustrate various enlarged top views of the supporting element of FIG. 6 according to some various embodiments of the present disclosure.

DETAILED DESCRIPTION

Figure 1:
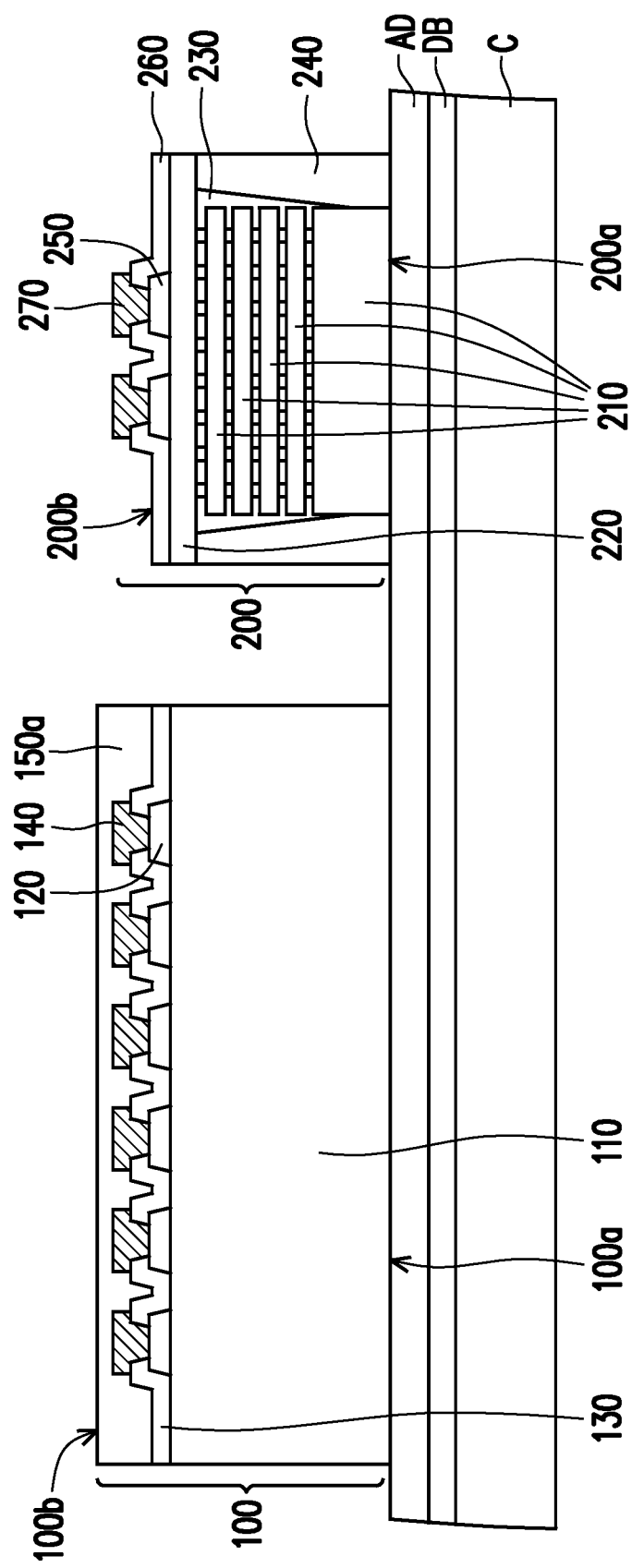
FIG. 1 to FIG. 6 and FIG. 9 to FIG. 15 are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor package including a supporting element and the manufacturing method thereof are provided in accordance with various embodiments. The intermediate stages of forming a semiconductor package are illustrated in accordance with some embodiments. Some variations of some embodiments are discussed. It should be appreciated that the illustration throughout the drawings are schematic and not in scale. Throughout the various views and illustrative embodiments, the identical or similar numbers refer to the identical or similar elements.

FIG. 1 to FIG. 6 and FIG. 9 to FIG. 15 are schematic cross-sectional views illustrating a manufacturing process of a semiconductor package 10 in accordance with some embodiments of the disclosure. Referring to FIG. 1, a carrier C having a de-bonding layer DB formed thereon is provided. In some embodiments, the carrier C is a glass substrate. However, other material may be adapted as a material of the carrier C as long as the material is able to withstand the following manufacturing processes while supporting the elements formed thereon. In some embodiments, the de-bonding layer DB is a light-to-heat conversion (LTHC) release layer formed on the glass substrate. The de-bonding layer DB may allow the structure formed on the carrier C in the subsequent processes to be peeled off from the carrier C.

As illustrated in FIG. 1, a first semiconductor device 100 and a second semiconductor device 200 are provided over the carrier C. In some embodiments, in FIG. 1, one first semiconductor device 100 is shown, but the number of the first semiconductor device 100 is not limited to be one but can be more than one. Similarly, the number of the second semiconductor device 200 is not limited to be one but can be more than one. In some embodiments, the first semiconductor device 100 and the second semiconductor device 200 are provided through a pick and place process.

In some embodiments, the first semiconductor device 100 is a semiconductor die. In some embodiments, the first semiconductor device 100 includes a system-on-chip (SoC) device, or any other suitable types of devices. The first semiconductor device 100, for example, includes a semiconductor substrate 110, a plurality of conductive pads 120, a passivation layer 130, a plurality of vias 140, and a protection layer 150a. In some embodiments, the conductive pads 120 are disposed over the semiconductor substrate 110. The passivation layer 130 is formed over the semiconductor substrate 110 and has contact openings that partially expose the conductive pads 120. The semiconductor substrate 110 may be a silicon substrate including active components (e.g., transistors or the like) and passive components (e.g., resistors, capacitors, inductors, or the like) formed therein. The conductive pads 120 may be aluminum pads, copper pads, or other suitable metal pads. The passivation layer 130 may be a silicon oxide layer, a silicon nitride layer, a silicon oxy-nitride layer, or a dielectric layer formed by other suitable dielectric materials. In addition, the vias 140 are formed on the conductive pads 120. In some embodiments, the vias 140 are made of conductive materials and are plated on the conductive pads 120. The protection layer 150a is formed on the passivation layer 130 to cover the vias 140. However, in some alternative embodiments, the first semiconductor device 100 further includes a post-passivation layer (not shown) formed over the passivation layer 130. The post-passivation layer covers the passivation layer 130 and has a plurality of contact openings. The conductive pads 120 are partially exposed from the contact openings of the post passivation layer. The post-passivation layer may be a polyimide (PI) layer, a PBO layer, or a dielectric layer formed by other suitable polymers.

In some embodiments, the second semiconductor device 200 is a package. In some embodiments, the second semiconductor device 200 includes a High-Bandwidth Memory (HBM) device, or any other suitable types of devices. The second semiconductor device 200, for example, includes a plurality of dies 210, a controller 220, an underfill 230, an encapsulant 240, a plurality of conductive pads 250, a passivation layer 260 and a plurality of vias 270. In some embodiments, the dies 210 are stacked together to form a die stack. The controller 220 is disposed over the die stack. The underfill 230 is formed between the dies 210 and between the die stack and the controller 220. The dies 210 and the underfill 230 are embedded in the encapsulant 240. The conductive pads 250 are disposed over the controller 220. The passivation layer 260 is formed over the controller 220 and has contact openings that partially expose the conductive pads 250. The conductive pads 250 may be aluminum pads, copper pads, or other suitable metal pads. The passivation layer 260 may be a silicon oxide layer, a silicon nitride layer, a silicon oxy-nitride layer, or a dielectric layer formed by other suitable dielectric materials. In addition, the vias 270 are formed on the conductive pads 250. In some embodiments, the vias 270 are made of conductive materials and are plated on the conductive pads 250.

As illustrated in FIG. 1, the first semiconductor device 100 has a rear surface 100a and a front surface 100b opposite to the rear surface 100a, and the second semiconductor device 200 has a rear surface 200a and a front surface 200b opposite to the rear surface 200a. In some embodiments, the rear surface 100a of the first semiconductor device 100 and the rear surface 200a of the second semiconductor device 200 are attached (or adhered) to the de-bonding layer DB through an adhesive layer AD. In some embodiments, the adhesive layer AD include a die attach film (DAF). On the other hand, the front surface 100b of the first semiconductor device 100 and the front surface 200b of the second semiconductor device 200 face upward.

Figure 2:
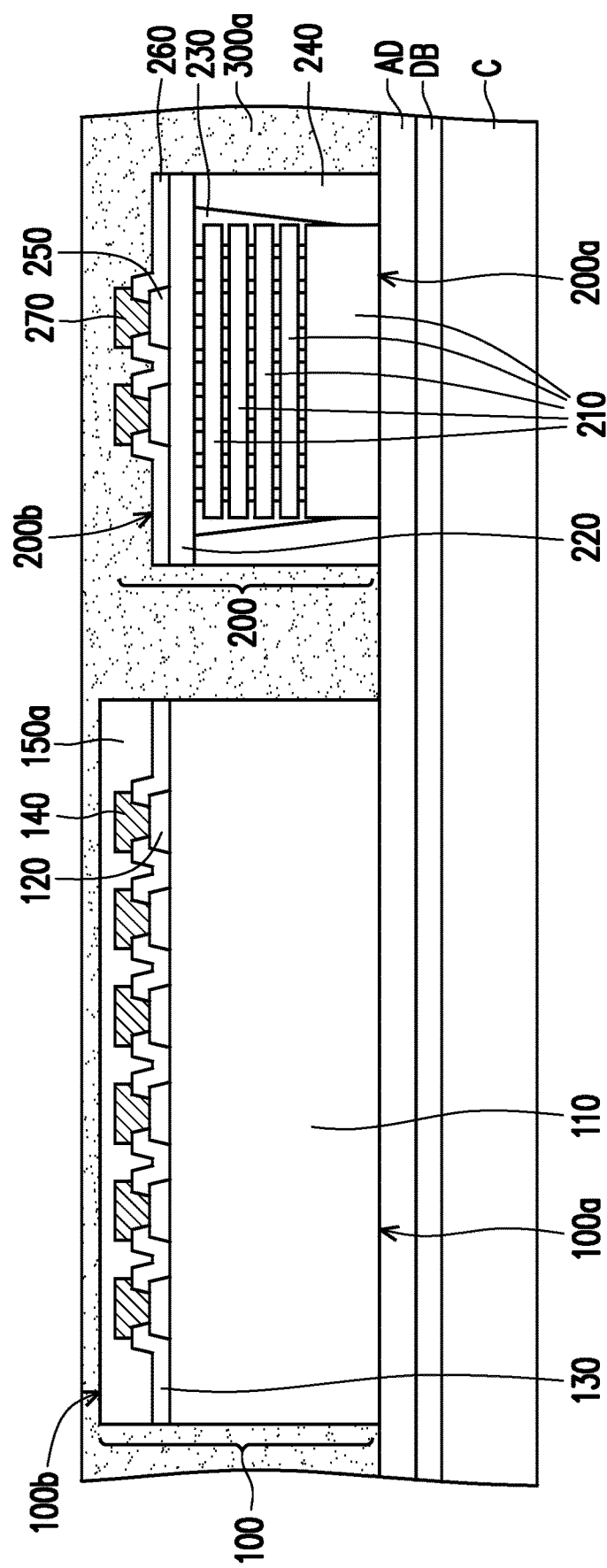

Referring to FIG. 2, an encapsulation material 300a is formed over the carrier C to encapsulate the first semiconductor device 100 and the second semiconductor device 200. The first semiconductor device 100 and the second semiconductor device 200 may not be revealed and may be well protected by the encapsulation material 300a. In some embodiments, the encapsulation material 300a is a molding compound, a molding underfill, a resin (such as epoxy), or the like. The encapsulation material 300a may be formed by a molding process. For example, the encapsulation material 300a may be formed by a compression molding process, a transfer molding process, or the like. A curing process is optionally performed to harden the encapsulation material 300a for optimum protection. In some embodiments, the encapsulation material 300a includes a base material and filler particles distributed in the base material. In some embodiments, the material of the base material includes epoxy resins, phenolic resins or silicon-containing resins, or the like, and the material of the filler particles includes silica, alumina, zinc oxide, titanium dioxide, or the like.

Figure 3:
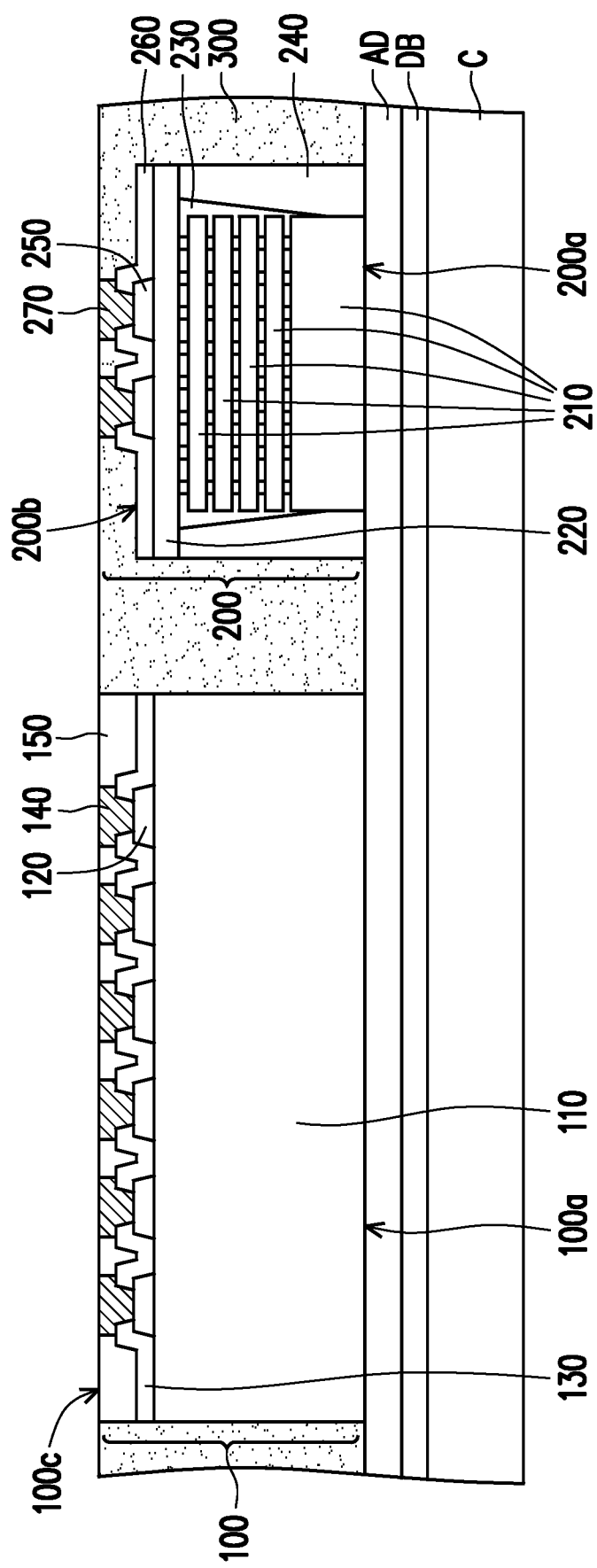

Referring to FIG. 2 and FIG. 3, a planarization process is performed on the encapsulation material 300a and the protection layer 150a of the first semiconductor device 100 to remove portions of the encapsulation material 300a and the protection layer 150a, until top surfaces of the vias 140 of the first semiconductor device 100 and top surfaces of the vias 270 of the second semiconductor device 200 are exposed. Due to the planarization, the encapsulation material 300a and the protection layer 150a may be reduced in thickness to form an insulating encapsulant 300 and a protection layer 150, respectively. The insulating encapsulant 300 is formed over the carrier C to encapsulate the first semiconductor device 100 and the second semiconductor device 200 and separate the first semiconductor device 100 from the second semiconductor device 200. In some embodiments, the planarization process is a mechanical grinding process and/or a chemical mechanical polishing (CMP) process. In some embodiments, portions of the vias 140 and/or portions of the vias 270 are slightly grinded as well. After the planarization process, the first semiconductor device 100 has an active surface 100c and a rear surface 100a opposite to the active surface 100c. The exposed portions of the vias 140 are located on the active surfaces 100c of the first semiconductor device 100. It is noted that the top surfaces of the vias 140, the top surface of the protection layer 150, and the top surfaces of the vias 270 are substantially coplanar with a top surface of the insulating encapsulant 300.

After forming the insulating encapsulant 300, a redistribution structure RDL (shown in FIG. 13) electrically connected to connectors underneath (e.g., the vias 140 of the first semiconductor device 100 and the vias 270 of the second semiconductor device 200) and a supporting element (or a buffer pattern) 400 (shown in FIG. 6) embedded in the redistribution structure RDL are then formed on the top surfaces of the insulating encapsulant 300, the vias 140, the protection layer 150, and the vias 270. The fabrication of the redistribution structure RDL and the supporting element 400 are described in accompany with FIG. 4 through FIG. 13 in detail.

Figure 4:
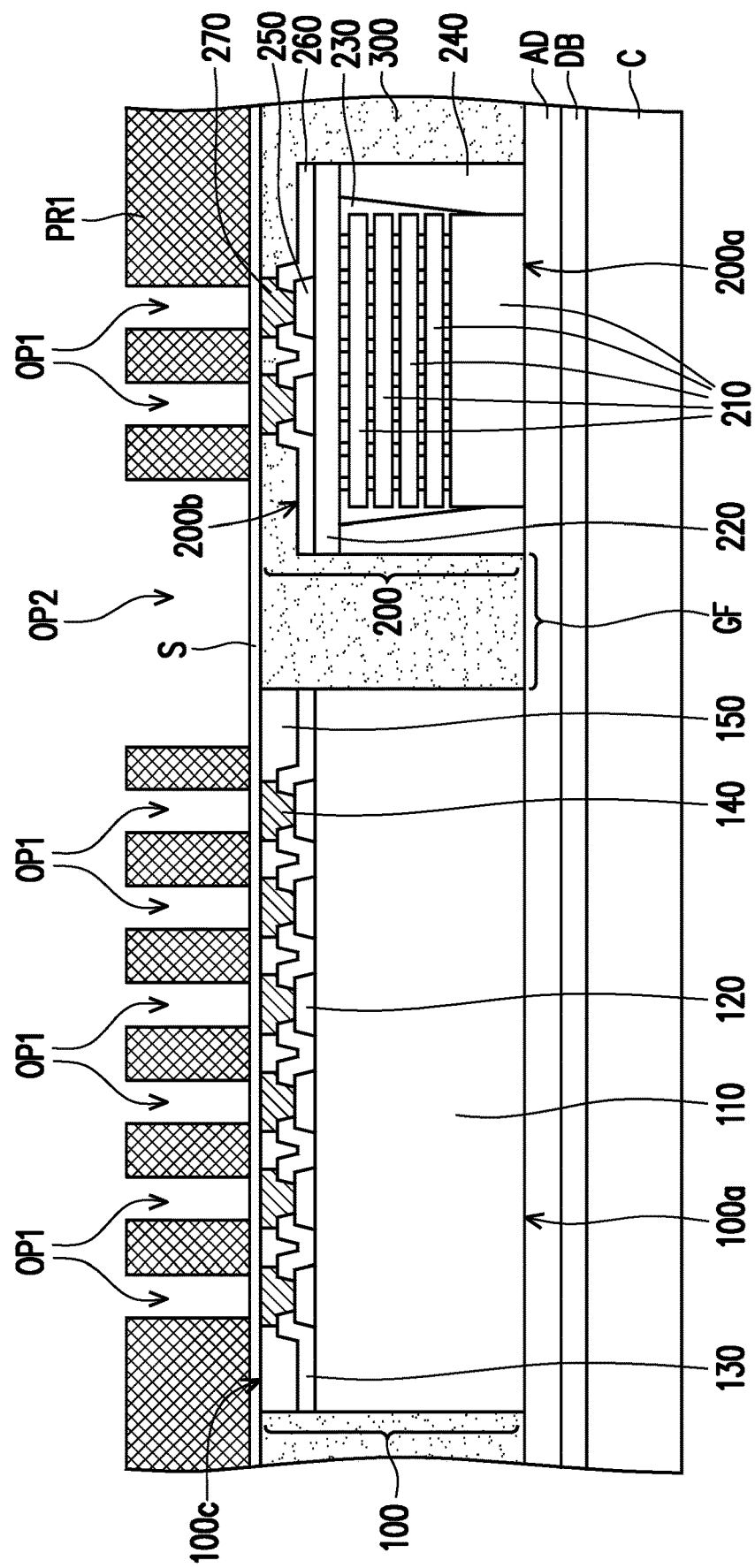

Referring to FIG. 4, a seed material layer S is formed on the insulating encapsulant 300, the first semiconductor device 100 and the second semiconductor device 200. In some embodiments, the seed material layer S is blanketly formed over the insulating encapsulant 300, the first semiconductor device 100 and the second semiconductor device 200. In some embodiments, the seed material layer S is formed to be in direct contact with the insulating encapsulant 300, the protection layer 150, the vias 140 and the vias 270. The seed material layer S may be formed through, for example, a sputtering process, a physical vapor deposition (PVD) process, or the like. In some embodiments, the seed material layer S may include, for example, copper, titanium-copper alloy, or other suitable choice of materials.

As illustrated in FIG. 4, a photoresist layer PR1 is formed over the seed material layer S. In some embodiments, the photoresist layer PR1 may be formed through spin-coating or other suitable formation methods. The photoresist layer PR1 has a plurality of openings OP1 and at least one opening OP2 exposing at least a portion of the seed material layer S. In some embodiments, the openings OP1 correspond to the locations of the vias 140 of the first semiconductor device 100 and the vias 270 of the second semiconductor device 200. For example, vertical projections of some of the openings OP1 along a direction perpendicular to the active surface 100c of the first semiconductor device 100 overlap with the vias 140 of the first semiconductor device 100. Similarly, vertical projections of some of the openings OP1 along the direction perpendicular to the active surface 200b of the second semiconductor device 200 overlap with the vias 270 of the second semiconductor device 200. In some embodiments, the at least one openings OP2 corresponds to the locations of a peripheral portion of the first semiconductor device 100, a peripheral portion of the second semiconductor device 200, and a gap-filling portion GF of the insulating encapsulant 300, wherein the gap-filling portion GF of the insulating encapsulant 300 fills the gap between the first semiconductor device 100 and the second semiconductor device 200. For example, a vertical projection of the openings OP2 along a direction perpendicular to the active surface 100c of the first semiconductor device 100 (or the active surface 200b of the second semiconductor device 200) overlaps with the peripheral portions of the first semiconductor device 100 and the second semiconductor device 200, and the gap-filling portion GF of the insulating encapsulant 300 between the first semiconductor device 100 and the second semiconductor device 200. In some embodiments, an area of each opening OP2 is much larger than an area of each opening OP1. For example, a ratio of the area of each opening OP2 to the area of each opening OP1 may range from about 10 to about 100000.

Figure 5:
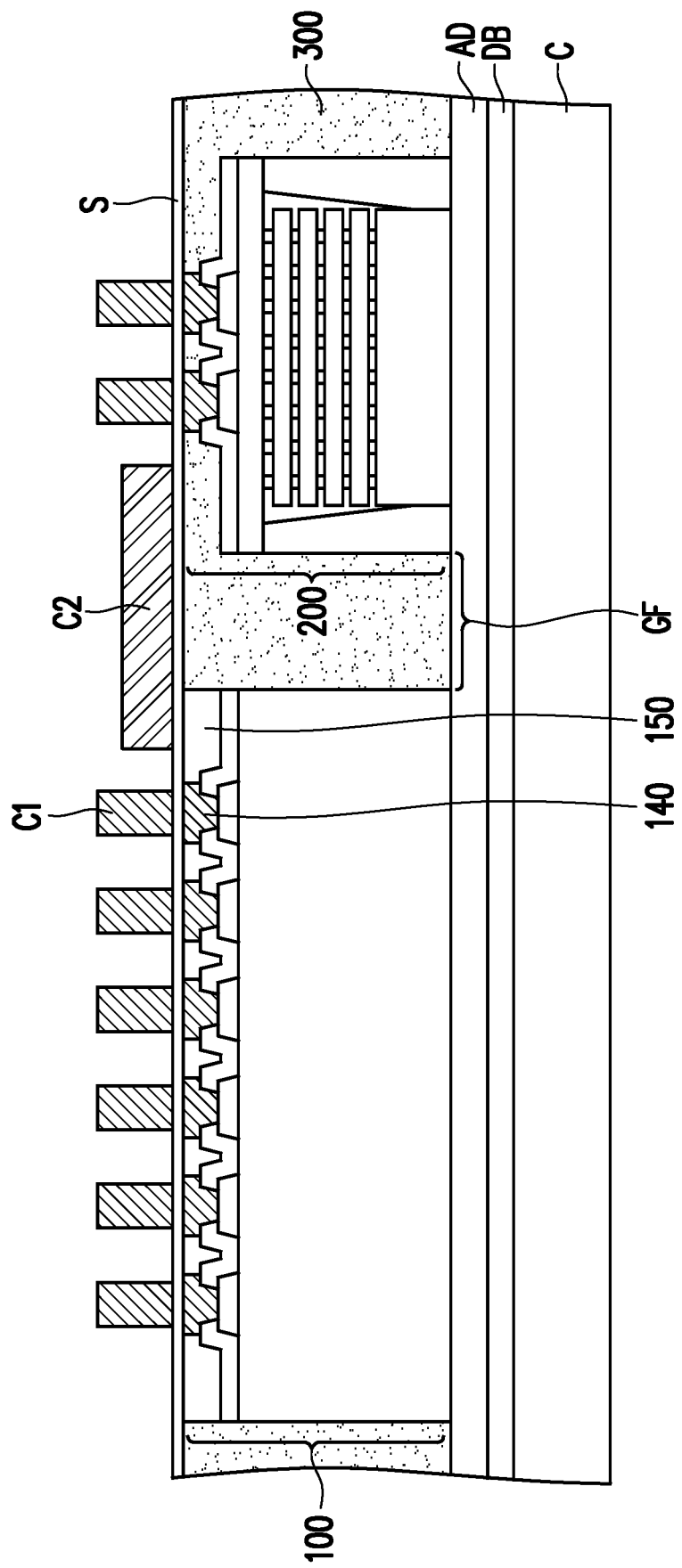

Referring to FIG. 4 and FIG. 5, a plurality of conductive patterns C1 and at least one conductive pattern C2 are formed on the seed material layer S. In some embodiments, a conductive material (not shown) is filled into the openings OP1 and the at least one opening OP2 of the photoresist layer PR1. Thereafter, the photoresist layer PR1 is removed to obtain the conductive patterns C1 and the at least one conductive pattern C2. Upon removal of the photoresist layer PR1, portions of the seed material layer S, which are not covered by the conductive patterns C1, C2, are exposed.

In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer PR1 may be removed/stripped through, for example, etching, ashing, or other suitable removal processes.

Figure 6:
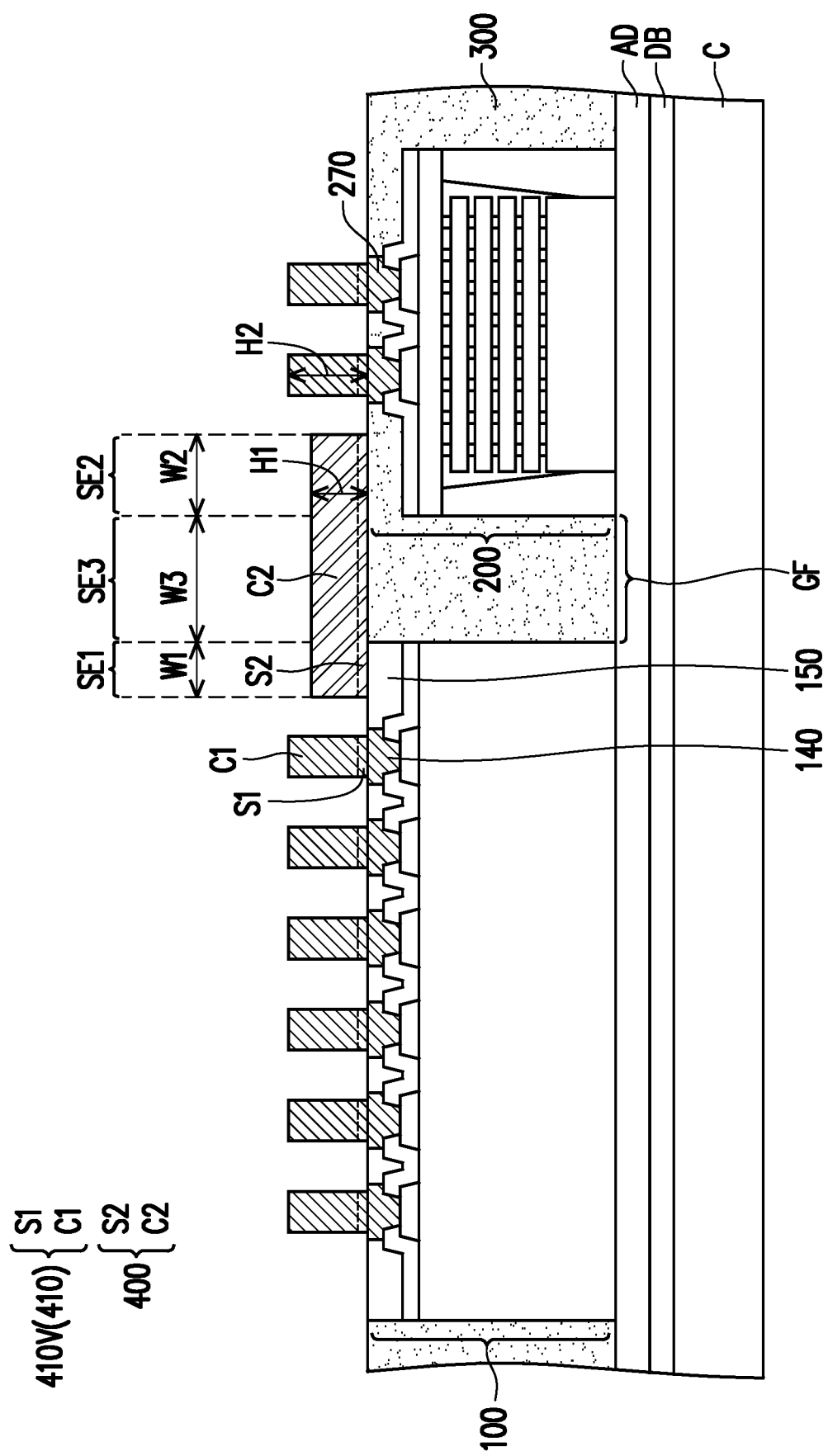

Referring to FIG. 5 and FIG. 6, the seed material layer S that is not covered by the conductive patterns C1, C2 is removed to render seed layers S1, S2. That is, the seed material layer S underneath the photoresist layer PR1 is removed. The exposed portions of the seed material layer S may be removed through an etching process. In some embodiments, the material of the conductive patterns C1, C2 may be different from the material of the seed material layer S, so the exposed portion of the seed material layer S may be removed through selective etching. In some embodiments, the conductive patterns C1 and the seed layers S1 located on the vias 140 and the vias 270 are collectively referred to as metallic vias 410V of a redistribution metallic layer 410. On the other hand, the conductive pattern C2 and the seed layer S2 located on the peripheral portions of the first semiconductor device 100 and the second semiconductor device 200 as well as the gap-filling portion GF of the insulating encapsulant 300 between the first semiconductor device 100 and the second semiconductor device 200 may be collectively referred to as the supporting element 400.

In some embodiments, the supporting element 400 and the metallic vias 410V of the redistribution metallic layer 410 are formed simultaneously, and the supporting element 400 is at a same level height as metallic vias 410V of the redistribution metallic layer 410. In some embodiments, the supporting element 400 is a metallic pattern. In some embodiments, the supporting element 400 and the metallic vias 410V of the redistribution metallic layer 410 have vertical sidewalls. In some embodiments, the metallic vias 410V of the redistribution metallic layer 410 are formed under a first plating rate, and the supporting element 400 is formed under a second plating rate less than the first plating rate because the area of each opening OP2 may be much larger than the area of each opening OP1. In other words, during the plating process, the plating rate of the supporting element 400 is lower than the plating rate of the metallic vias 410V of the redistribution metallic layer 410, so that a height H1 of the supporting element 400 is less than a height H2 of the metallic vias 410V of the redistribution metallic layer 410. In some embodiments, the height H1 of the supporting element 400 is, for example, about 50 micrometers.

As illustrated in FIG. 6, the metallic vias 410V are located on the vias 140 and the vias 270, and the supporting element 400 is located between the metallic vias 410V on the vias 140 and the metallic vias 410V on the vias 270. In some embodiments, the metallic vias 410V of the redistribution metallic layer 410 may electrically connect the vias 140 of the first semiconductor device 100 and/or the vias 270 of the second semiconductor device 200 with other subsequently formed elements. In some embodiments, the supporting element 400 is electrically floating. For example, the supporting element 400 is electrically insulated from the metallic vias 410V of the redistribution metallic layer 410, the vias 140 of the first semiconductor device 100, the vias 270 of the second semiconductor device 200, and the redistribution structure RDL. In some embodiments, the supporting element 400 is in physical contact with the insulating encapsulant 300 and the protection layer 150 of the first semiconductor device 100. In some embodiments, the supporting element 400 is spaced apart from the second semiconductor device 200 by the insulating encapsulant 300. The detailed descriptions of the supporting element 400 will be discussed below in conjunction with FIGS. 7A-7C, and FIGS. 8A-8B.

FIG. 7A to FIG. 7C illustrate various enlarged top views of the supporting element of FIG. 6 according to some various embodiments of the present disclosure. For illustration purpose, in FIG. 7A to FIG. 7C, the second semiconductor device 200 covered by the insulating encapsulant 300 is also shown and indicated by a dash line. Referring to FIG. 6 and FIGS. 7A-7C, the supporting element 400 includes a first segment SE1, a second segment SE2 and a third segment SE3 connected between the first segment SE1 and the second segment SE2. In some embodiments, the first segment SE1 overlaps a portion of the first semiconductor device 100. The second segment SE2 overlaps a portion of the second semiconductor device 200. The third segment SE3 overlaps a gap-filling portion GF of the insulating encapsulant 300, wherein the gap-filling portion GF fills into the gap between the first semiconductor device 100 and the second semiconductor device 200. That is to say, the supporting element 400 spans and extends over a boundary BD1 between the first semiconductor device 100 and the insulating encapsulant 300 as well as a boundary BD2 between the second semiconductor device 200 and the insulating encapsulant 300. In other words, the supporting element 400 extends beyond the span of the gap-filling portion GF of the insulating encapsulant 300 between the first semiconductor device 100 and the second semiconductor device 200. In some embodiments, a width W1 of the first segment SE1 may range from about 10 micrometers to about 1000 micrometers, for example, about 20 micrometers. In some embodiments, a width W2 of the second segment SE2 may range from about 10 micrometers to about 1000 micrometers, for example, about 20 micrometers. In some embodiments, a width W3 of the third segment SE3 may be less than about 200 micrometers, for example, ranging from about 30 micrometers to about 40 micrometers.

In some embodiments, the supporting element 400 has a plurality of pores P that partially expose the underlying elements. In some embodiments, the pores P are located in the first segment SE1, the second segment SE2 and/or the third segment SE3. For example, in FIG. 7A and FIG. 7B, the pores P are located in the first segment SE1, the second segment SE2 and the third segment SE3, wherein the pores P in the first segment SE1 expose the first semiconductor device 100, and the pores P in the second segment SE2 and the third segment SE3 expose the insulating encapsulant 300. In FIG. 7C, the pores P are located in the first segment SE1 and the third segment SE3, wherein the pores P in the first segment SE1 expose the first semiconductor device 100, and the pores P in the third segment SE3 expose the insulating encapsulant 300. In FIG. 7A, the pores P from the top view may be shaped as rectangular pores. In FIG. 7B and FIG. 7C, the pores P from the top view may be shaped as rhombus pores. However, in alternative embodiments, the pores of the supporting element 400 may have other shapes, such as round or oval shapes.

Figure 8A:
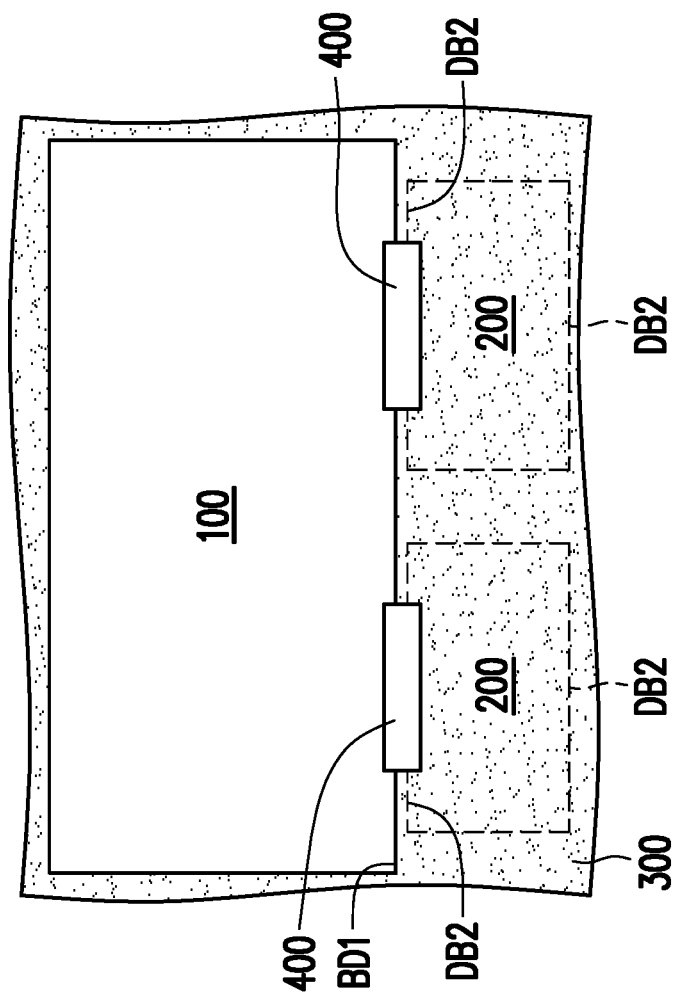
FIG. 8A and FIG. 8B illustrate various top views of the supporting element, the first semiconductor device and the second semiconductor device of FIG. 6 according to some various embodiments of the present disclosure.
Figure 8B:
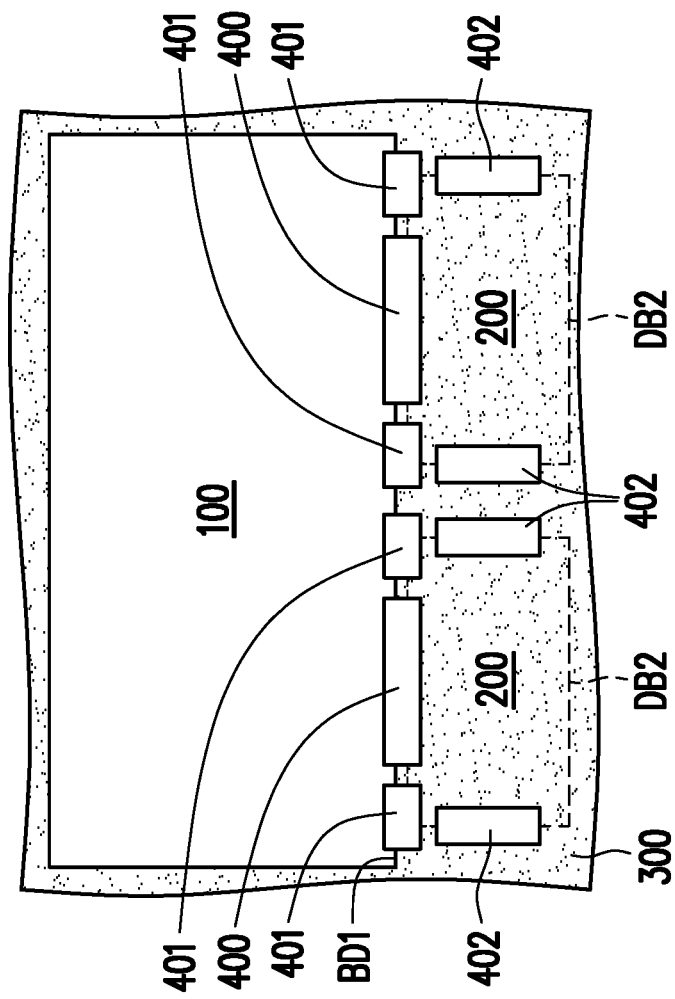

FIG. 8A and FIG. 8B illustrate various top views of the supporting element, the first semiconductor device and the second semiconductor device of FIG. 6 according to some various embodiments of the present disclosure. For illustration purpose, in FIG. 8A and FIG. 8B, the second semiconductor devices 200 covered by the insulating encapsulant 300 are also shown and indicated by a dash line. Referring to FIG. 8A and FIG. 8B, one first semiconductor device 100 and two second semiconductor device 200 are shown. In FIG. 8A, two supporting elements 400 are provided over the gap regions of the insulating encapsulant 300 between the first semiconductor device 100 and second semiconductor device 200, wherein each of the supporting elements 400 spans and extends over the boundary BD1 between the first semiconductor device 100 and the insulating encapsulant 300 as well as the boundary BD2 between the second semiconductor device 200 and the insulating encapsulant 300.

In FIG. 8B, the structure is similar to the structure in FIG. 8A, except that the structure in FIG. 8B further includes supporting elements 401 and supporting elements 402 similar to the supporting element 400. In some embodiments, the supporting elements 400, 401 and 402 are arranged along the peripheries/edges of the first semiconductor device 100 and/or the second semiconductor device 200. In some embodiments, each of the supporting elements 401 overlaps a corner of the second semiconductor device 200, and extends over the boundary BD1 between the first semiconductor device 100 and the insulating encapsulant 300 as well as the boundary BD2 between the second semiconductor devices 200 and the insulating encapsulant 300. In some embodiments, one supporting element 400 is located between two adjacent supporting elements 401. In some embodiments, each of the supporting elements 402 overlaps a sidewall of the second semiconductor device 200 which does not face the first semiconductor device 100. The supporting element merely extends over the boundary BD2 between the second semiconductor device 200 and the insulating encapsulant 300. In other words, each of the supporting elements 402 has a first segment overlapping a portion of the second semiconductor devices 200 and a second segment being connected to the first segment and overlapping a portion of the insulating encapsulant 300.

Figure 9:
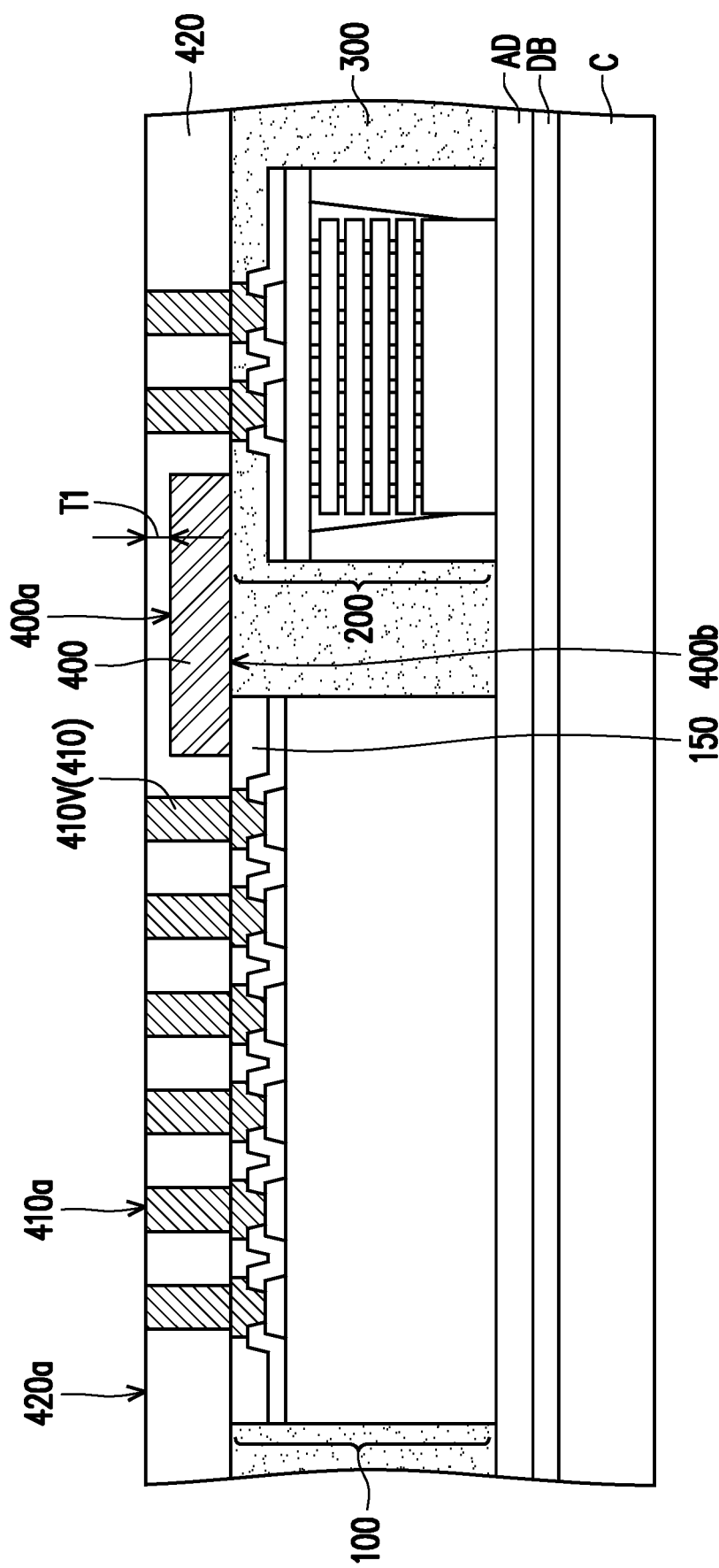

Referring to FIG. 9, a dielectric material layer (not shown) is formed over the insulating encapsulant 300, the first semiconductor device 100 and the second semiconductor device 200 to encapsulate the metallic vias 410V of the redistribution metallic layer 410 and the at least one supporting element 400. In other words, the metallic vias 410V of the redistribution metallic layer 410 and the at least one supporting element 400 are not revealed and are well protected by the dielectric material layer. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Subsequently, a portion of the dielectric material layer is removed to form a dielectric layer 420 exposing top surfaces 410a of the metallic vias 410V. For example, the dielectric material layer may be planarized until top surfaces 410a of the metallic vias 410V are exposed, while the at least one supporting element 400 is still covered by the dielectric layer 420. In some embodiments, the dielectric material layer is planarized by a chemical mechanical polishing (CMP) process. In some embodiments, portions of the metallic vias 410V are slightly grinded as well. It is noted that the top surfaces 410a of the metallic vias 410V are substantially coplanar with a top surface 420a of the dielectric layer 420, and a top surface 400a of the at least one supporting element 400 is lower than the top surface 420a of the dielectric layer 420. Since the at least one supporting element 400 is not revealed and is well protected by the dielectric layer 420, the at least one supporting element 400 is separated from other subsequently formed elements (e.g., the metallic lines 412L in FIG. 10). In some embodiments, a thickness T1 of the dielectric layer 420 directly over the supporting element 400 may range from about 1 micrometer to about 100 micrometers.

In some embodiments, the dielectric layer 420 fills the pores (e.g., the pores P in FIG. 7A to FIG. 7C) of the supporting element 400 to form a plurality of protruding portions (not shown) extending through the supporting element 400. In other words, the pores (e.g., the pores P in FIG. 7A to DIG. 7C) of the supporting element 400 are filled with the dielectric material of the dielectric layer 420. In some embodiments, the protruding portions of the dielectric layer 420 extend from the top surface 400a of the supporting element 400 to the bottom surface 400b of the supporting element 400. In some embodiments, the protruding portions of the dielectric layer 420 are in contact with the protection layer 150 of the first semiconductor device 100 and/or the insulating encapsulant 300. With such arrangement, the pores P of the supporting element 400 may be utilized to reduce or eliminate delamination or peeling that may occur along the surface of the supporting element 400, and the structural strength of the redistribution structure RDL may be enhanced.

Figure 10:
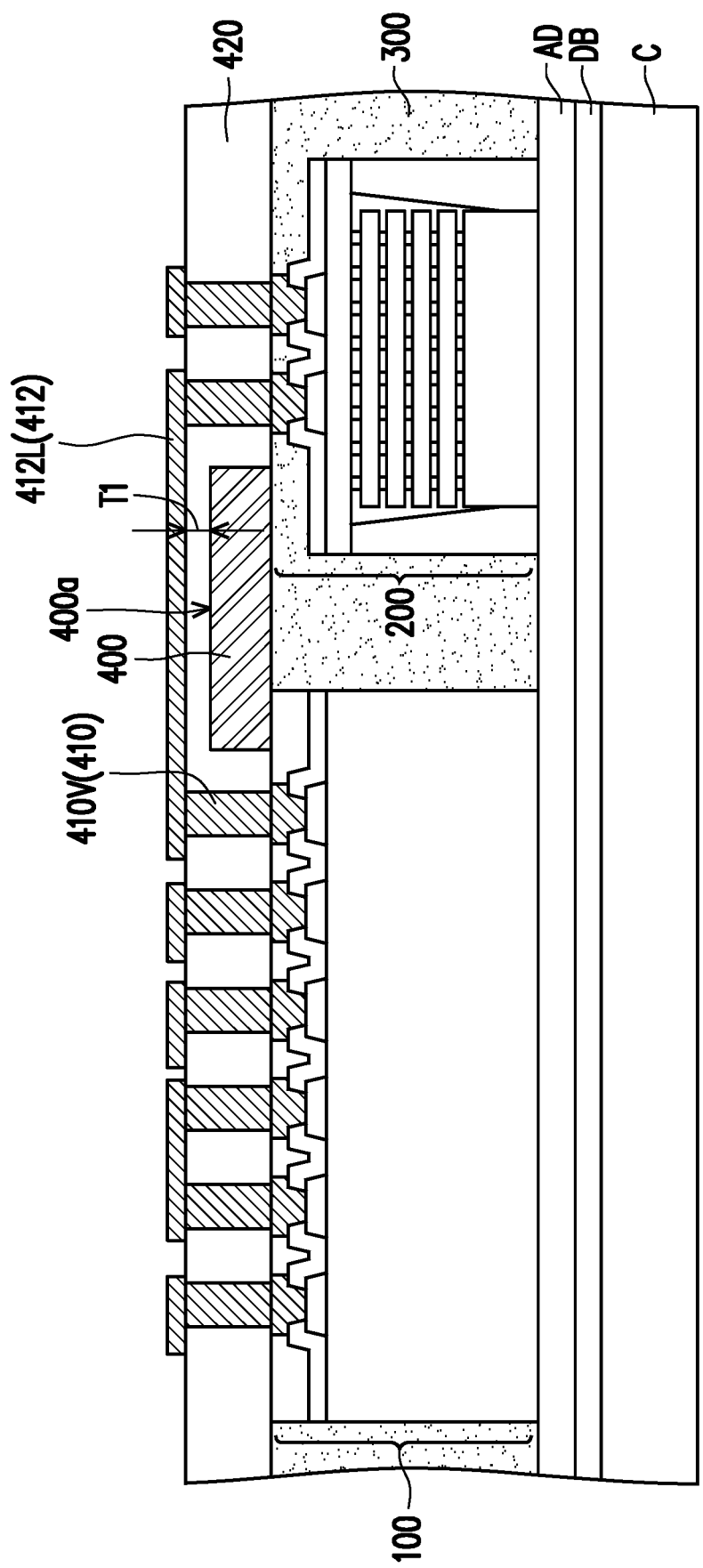

Referring to FIG. 10, a redistribution metallic layer 412 is formed over the supporting element 400, the redistribution metallic layer 410 and the dielectric layer 420. In some embodiments, the method of forming the redistribution metallic layer 412 includes the following steps. First, a seed material layer (not shown) is formed over the dielectric layer 420. The seed material layer may be similar to the aforementioned seed material layer S, so the detailed descriptions thereof are omitted herein. In some embodiments, the seed material layer is blanketly formed to be in direct contact with the dielectric layer 420 and the redistribution metallic layer 410. Then, a photoresist layer (not shown) having a plurality of openings exposing at least a portion of the seed material layer is formed over the seed material layer. Then, a conductive material (not shown) is filled into the openings of the photoresist layer and the photoresist layer is removed, so as to form a plurality of conductive patterns on the seed material layer. Upon removal of the photoresist layer, portions of the seed material layer, which are not covered by the conductive patterns, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer may be removed/stripped through, for example, etching, ashing, or other suitable removal processes. Then, the seed material layer that is not covered by the conductive patterns is removed to render seed layers. The exposed portions of the seed material layer may be removed through an etching process. In some embodiments, the conductive patterns and the seed layers are collectively referred to as metallic lines 412L of the redistribution metallic layer 412.

As illustrated in FIG. 10, the metallic lines 412L of the redistribution metallic layer 412 may electrically connect the first semiconductor device 100 to the second semiconductor device 200 through the metallic vias 410V of the redistribution metallic layer 410, and may electrically connect the first semiconductor device 100 and/or the second semiconductor device 200 with other subsequently formed elements. In some embodiments, bottom surfaces of the metallic lines 412L keep a distance (i.e., the thickness T1) from the top surface 400a of the supporting element 400 to electrically isolate the supporting element 400 from the metallic lines 412L of the redistribution metallic layer 412. In some embodiments, a shortest distance between the metallic lines 412L of the redistribution metallic layer 412 and the semiconductor devices 100, 200 is determined by a thickness of the dielectric layer 420. For example, the thickness of the dielectric layer 420 may range from about 2 micrometers to about 150 micrometers.

Figure 11:
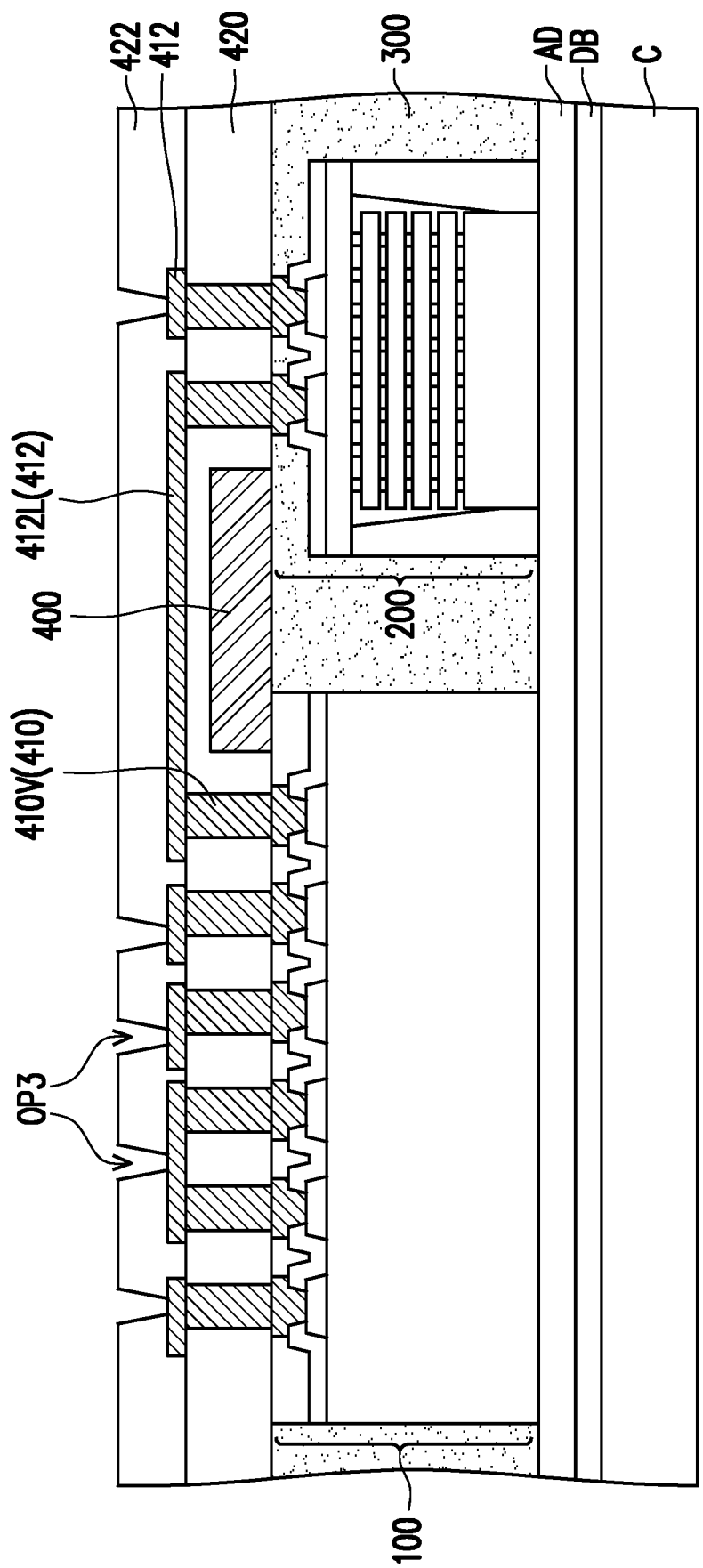

Referring to FIG. 11, a dielectric material layer (not shown) is formed over the dielectric layer 420 to encapsulate the metallic lines 412L of the redistribution metallic layer 412. In other words, the metallic lines 412L of the redistribution metallic layer 412 are not revealed and are well protected by the dielectric material layer. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Subsequently, the dielectric material layer is patterned to form a dielectric layer 422 having a plurality of openings OP3 for exposing portions of the metallic lines 412L. In some embodiments, the dielectric material layer includes a photo-sensitive material which may be easily patterned by exposure and development processes. In alternative embodiments, the dielectric material layer is patterned by an etching process.

Figure 12:
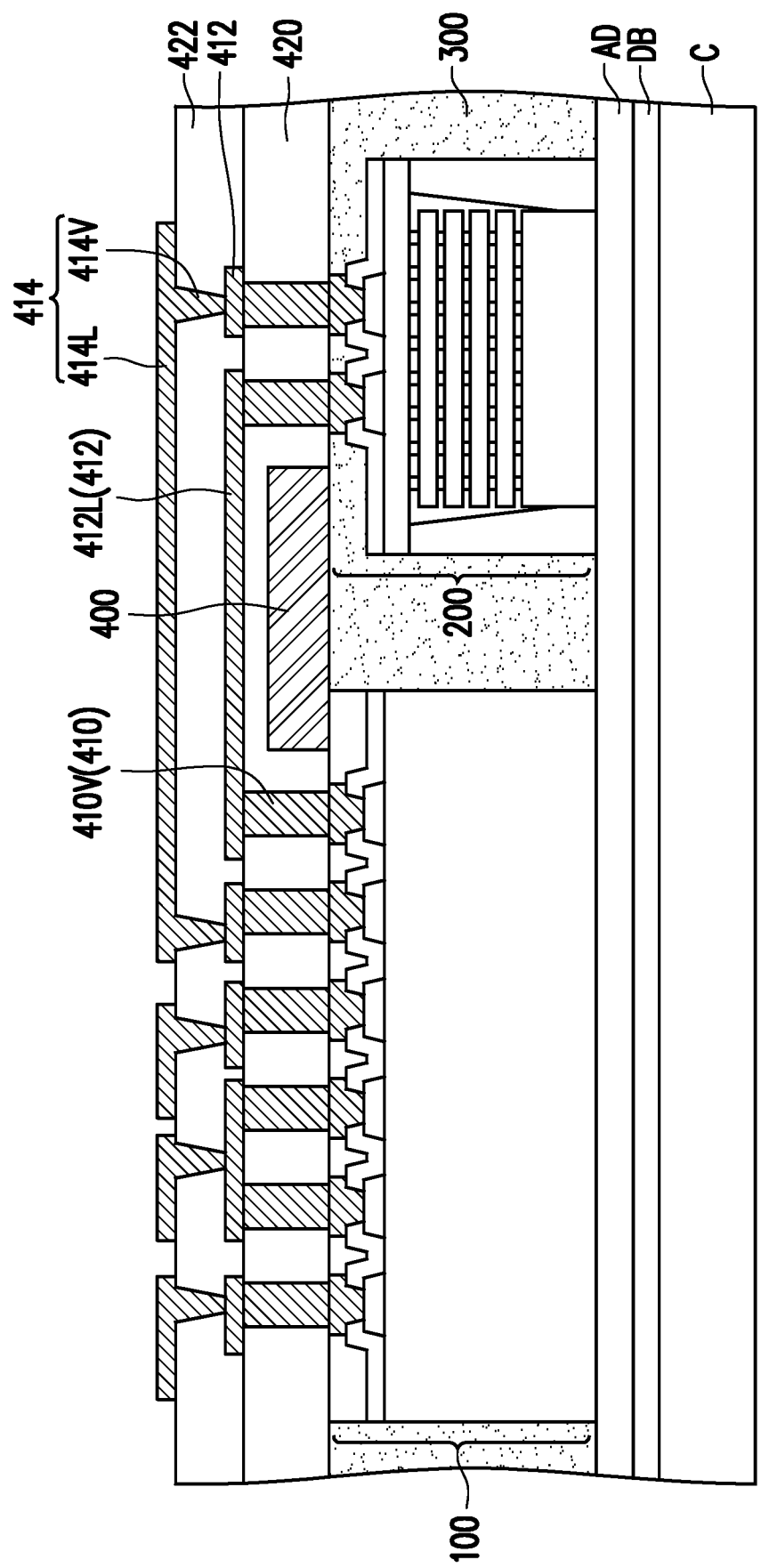

Referring to FIG. 11 and FIG. 12, a redistribution metallic layer 414 is formed over the redistribution metallic layer 412 and the dielectric layer 422. In some embodiments, the method of forming the redistribution metallic layer 414 includes the following steps. First, a seed material layer (not shown) is formed over the dielectric layer 422 and extends into the openings OP3 of the dielectric layer 422. The seed material layer may be similar to the aforementioned seed material layer S, so the detailed descriptions thereof are omitted herein. In some embodiments, the seed material layer is blanketly formed to be in direct contact with the dielectric layer 420 and portions of the redistribution metallic layer 412. Then, a photoresist layer (not shown) having a plurality of openings exposing at least a portion of the seed material layer is formed over the seed material layer. Then, a conductive material (not shown) is filled into the openings of the photoresist layer and the photoresist layer is removed, so as to form a plurality of conductive patterns on the seed material layer. Upon removal of the photoresist layer, portions of the seed material layer, which are not covered by the conductive patterns, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer may be removed/stripped through, for example, etching, ashing, or other suitable removal processes. Then, the seed material layer that is not covered by the conductive patterns is removed to render seed layers. The exposed portions of the seed material layer may be removed through an etching process. In some embodiments, the conductive patterns and the seed layers are collectively referred to as the redistribution metallic layer 414. In some embodiments, the redistribution metallic layer 414 includes metallic lines 414L on the dielectric layer 422 and metallic vias 414V penetrating through the dielectric layer 422 to be electrically connected to the redistribution metallic layer 412. In some embodiments, the metallic vias 414V of the redistribution metallic layer 414 have tapered sidewalls.

Figure 13:
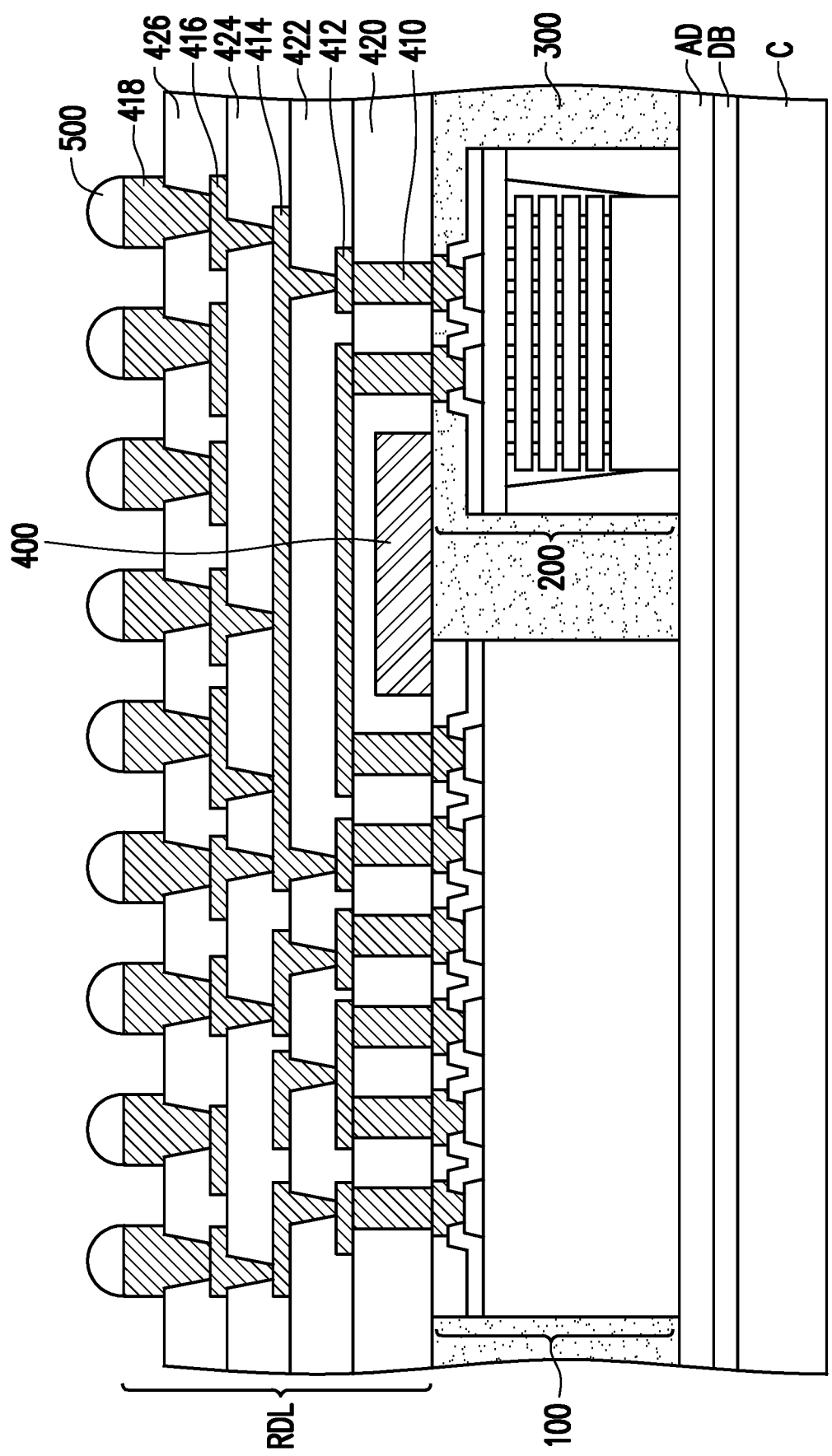

Referring to FIG. 13, a dielectric layer 424 is formed on the dielectric layer 422 and the redistribution metallic layer 414. A redistribution metallic layer 416 is formed on the dielectric layer 424 and penetrates through the dielectric layer 424 to be electrically connected to the redistribution metallic layer 414. A dielectric layer 426 is formed on the dielectric layer 424 and the redistribution metallic layer 416. A redistribution metallic layer 418 is formed on the dielectric layer 426 and penetrates through the dielectric layer 426 to be electrically connected to the redistribution metallic layer 416. In some embodiments, the dielectric layer 424 and 426 and the redistribution metallic layer 416 and 418 may be formed using the same methods and materials as the dielectric layer 422 and the redistribution metallic layer 414 described above, and the detailed description is thus omitted herein. It is noted that the redistribution structure RDL illustrated herein is an example, and the numbers of the dielectric layer and the redistribution metallic layer may not be limited by the disclosure. In some alternative embodiments, more layers of the redistribution metallic layer and more layers of the dielectric layer may be formed depending on the circuit design. When more layers of redistribution metallic layer and more layers of the dielectric layer are adapted, these redistribution metallic layers and these dielectric layers are stacked alternately, and the redistribution metallic layers are interconnected with one another by the metallic vias or the metallic lines.

In some embodiments, the topmost one of the redistribution metallic layers (e.g., redistribution metallic layer 418) includes a part (e.g., under-ball metallurgy (UBM) patterns) for electrically connecting with the later-formed components. In some embodiments, after the redistribution structure RDL is formed, a plurality of conductive terminals 500 are formed on the UBM patterns of the redistribution metallic layer 418 by a ball placement process, a plating process, or other suitable processes. In some embodiments, the conductive terminals 500 are electrically coupled to the first semiconductor device 100 and the second semiconductor device 200 through the redistribution structure RDL. For example, the conductive terminals 500 include controlled collapse chip connection (C4) bumps, micro-bumps, solder balls, ball grid array (BGA) balls, or other suitable terminals for providing external connections to the first semiconductor device 100 and the second semiconductor device 200. Other possible forms and shapes of the conductive terminals 500 may be utilized according to design requirements. In some embodiments, a soldering process and a reflow process are optionally performed for enhancement of the adhesion between the conductive terminals 500 and the redistribution structure RDL.

Figure 14:
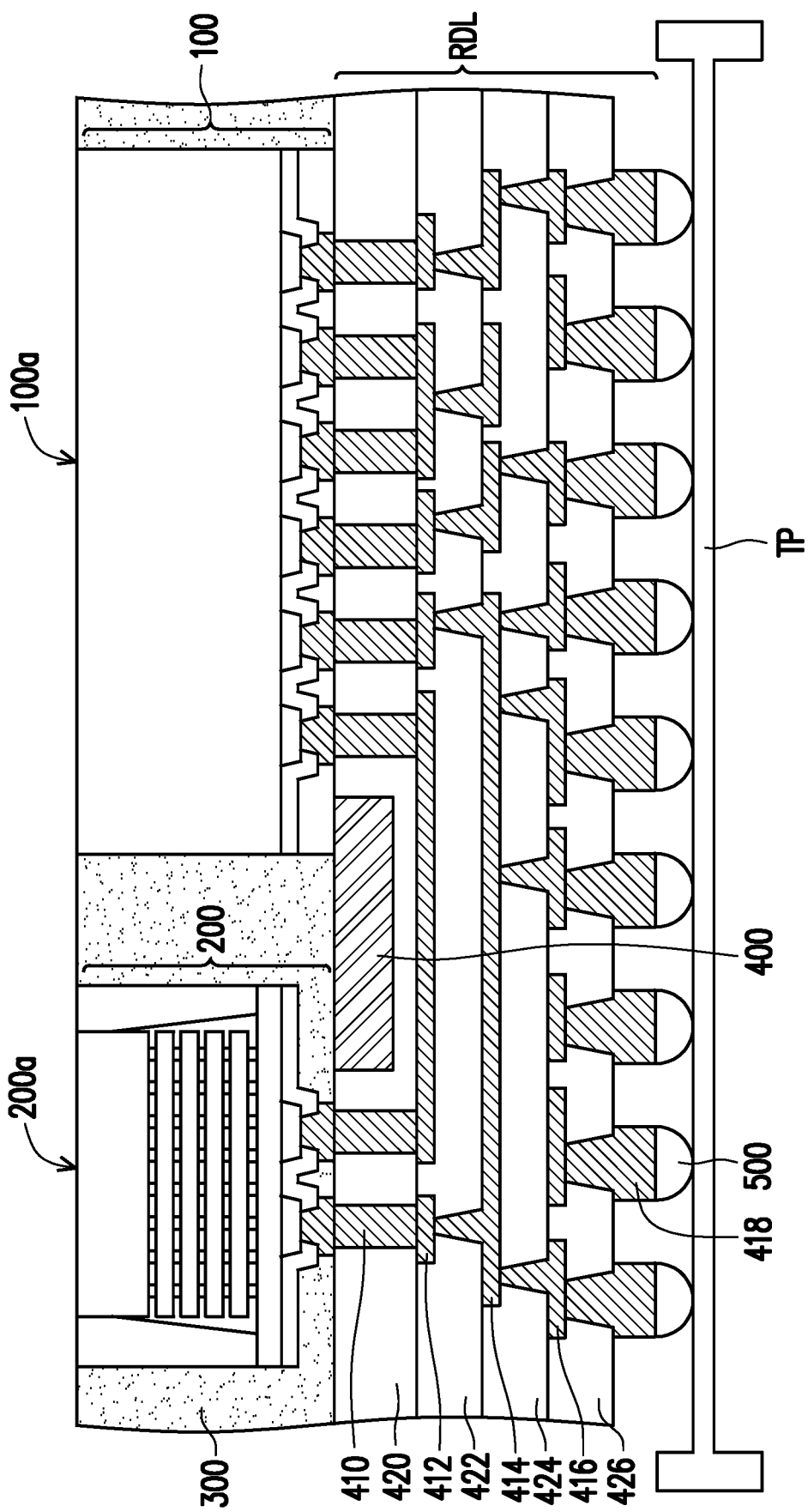

Referring to FIG. 13 and FIG. 14, after the conductive terminals 500 are formed on the redistribution structure RDL, the carrier C is de-bonded or removed from the resulting structure. In some embodiments, the de-bonding layer DB (e.g., the LTHC release layer) may be irradiated by an UV laser such that the carrier C and the de-bonding layer DB may be peeled off. Nevertheless, the de-bonding process is not limited thereto. Other suitable de-carrier methods may be used in some alternative embodiments. In some embodiments, the adhesive layer AD (e.g., die attach film (DAF)) may be subsequently removed, and the rear surface 100b of the first semiconductor device 100 and the rear surface 200b of the second semiconductor device 200 are exposed. After removing the de-bonding layer DB, the carrier C and the adhesive layer AD, the structure is flipped upside down and is placed on a tape TP.

Figure 15:
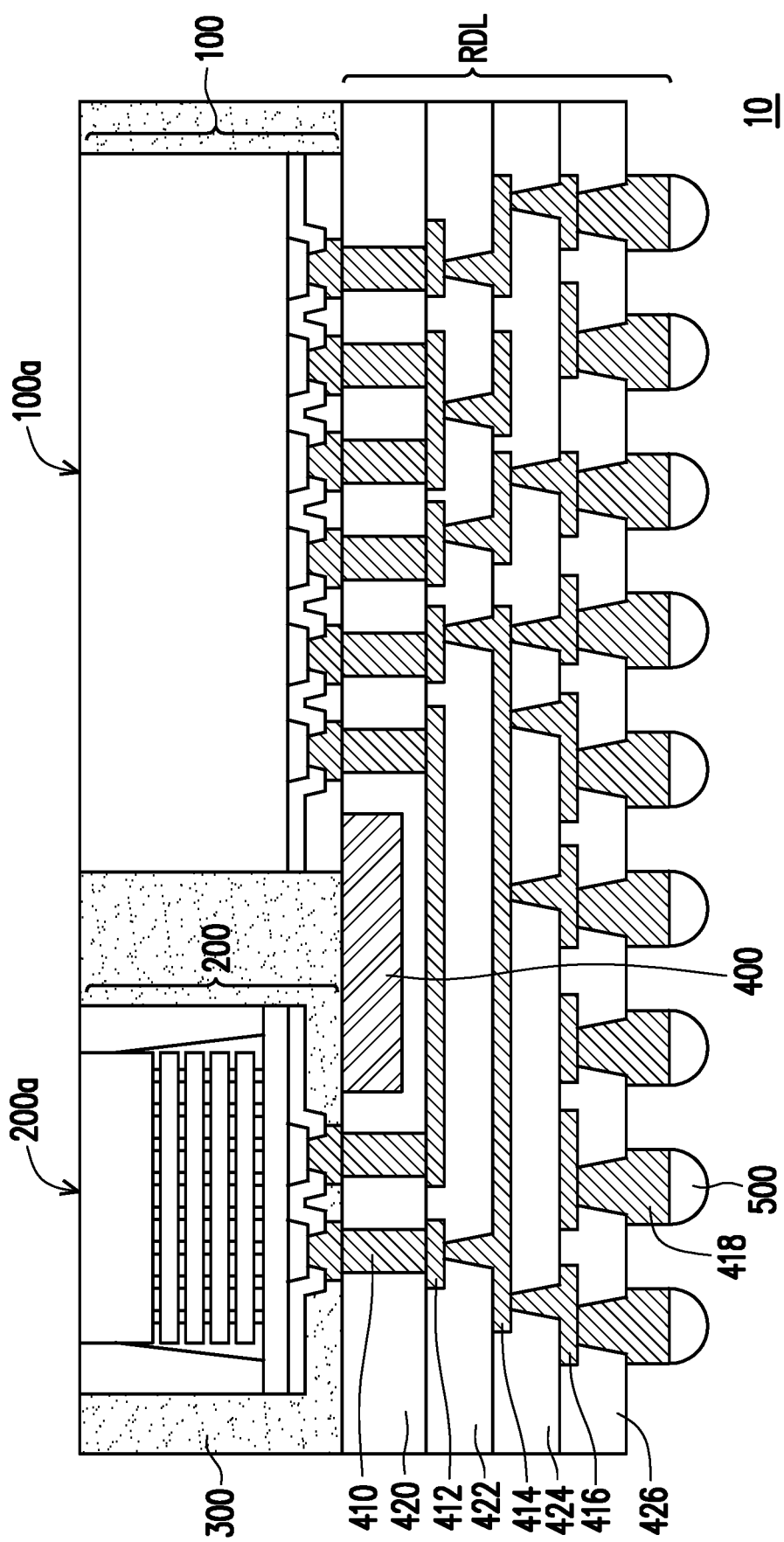

Referring to FIG. 14 and FIG. 15, the structure illustrated in FIG. 14 is diced or singulated. Thereafter, the diced structure is removed from the tape TP to form a plurality of semiconductor packages 10. In some embodiments, the dicing process or the singulation process typically involves dicing with a rotating blade or a laser beam. In other words, the dicing or singulation process is, for example, a laser cutting process, a mechanical cutting process, or other suitable processes. Up to here, the fabrication of the semiconductor package 10 is substantially complete.

As illustrated in FIG. 15, the semiconductor package 10 includes the first semiconductor device 100 and the second semiconductor device 200 laterally encapsulated by the insulating encapsulant 300. The redistribution structure RDL is on the first semiconductor device 100, the second semiconductor device 200 and the insulating encapsulant 300, and is electrically connected to the first semiconductor device 100 and the second semiconductor device 200, wherein the supporting element (or a buffer pattern) 400 is embedded in the redistribution structure RDL, and the supporting element 400 is in contact with the first semiconductor device 100 and the insulating encapsulant 300.

Different materials may each have different coefficients of thermal expansion (CTE). This type of coefficient of thermal expansion mismatch causes each one of the materials to expand differently when the semiconductor package is heated during, for example, testing or use. As such, at elevated temperatures there is a coefficient of thermal expansion mismatch that causes stresses to form between the different materials and, hence, the different parts of the semiconductor package. These stresses may cause delamination to occur between the various layers of material. In some embodiments, the supporting element 400 is used as a buffer between the encapsulated semiconductor devices 100, 200 and the redistribution structure RDL to reduce and absorb stress which is caused by coefficient of thermal expansion (CTE) mismatch between different materials. The supporting element 400 may prevent the metallic lines of the redistribution structure RDL from being opened induced by the delamination of the insulating encapsulant 300 from the semiconductor devices 100, 200. Accordingly, the reliability of the redistribution structure RDL may be improved.

Figure 16:
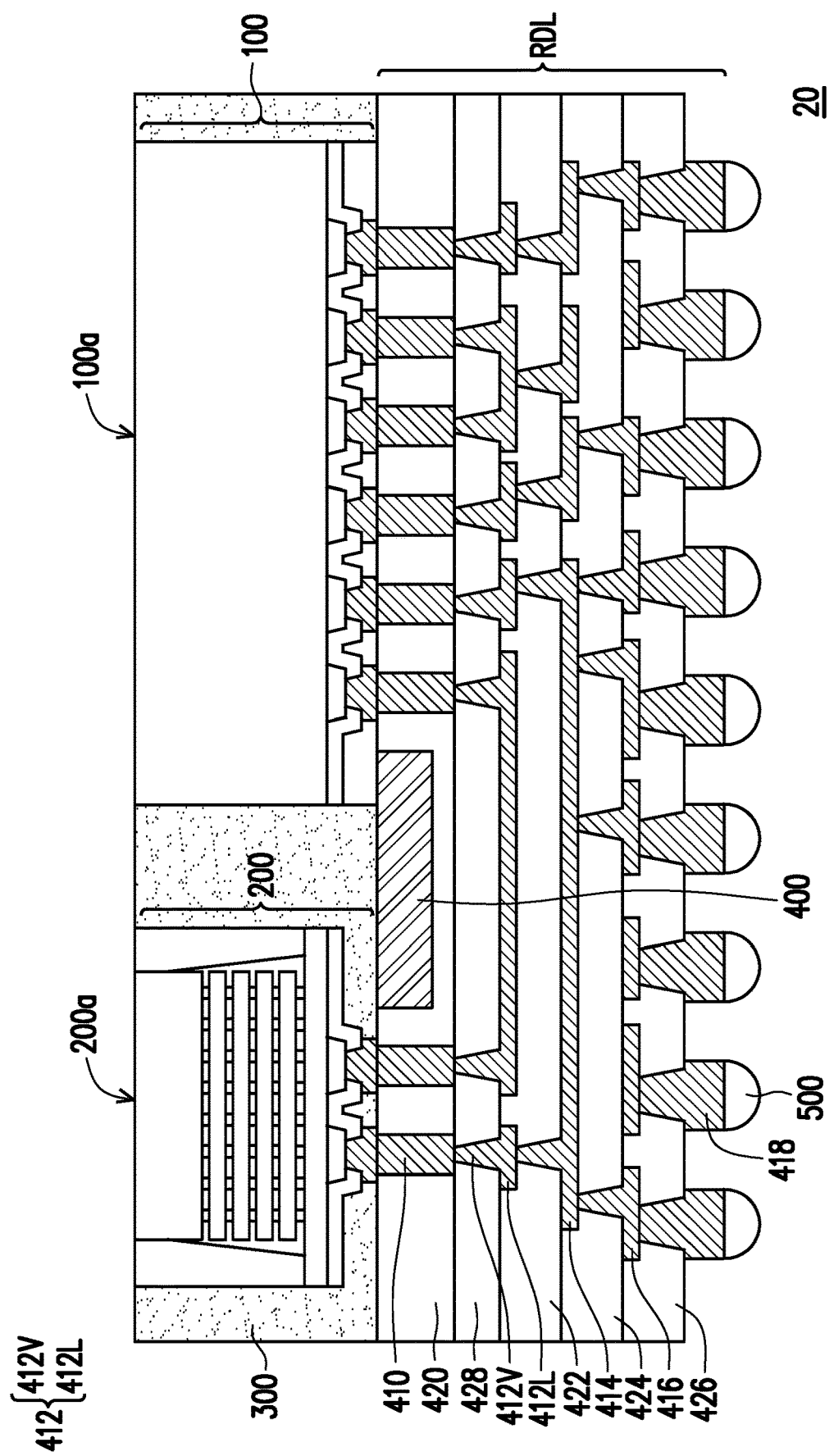
FIG. 16 is a schematic cross-sectional view illustrating a semiconductor package in accordance with some other embodiments of the disclosure.

FIG. 16 is a schematic cross-sectional view illustrating a semiconductor package in accordance with some other embodiments of the disclosure. In some embodiments, the semiconductor package 20 is similar to the semiconductor package 10 illustrated in FIG. 15, except that the redistribution structure RDL of the semiconductor package 20 further includes a dielectric layer 428 between the dielectric layer 420 and the dielectric layer 422, and the redistribution metallic layer 412 further includes metallic vias 412V penetrating through the dielectric layer 428 to be electrically connected to the redistribution metallic layer 410. In some embodiments, after the supporting element 400, the redistribution metallic layer 410 and the dielectric layer 420 are formed, and before the dielectric layer 422 is formed, the dielectric layer 428 is formed on the dielectric layer 420 and the redistribution metallic layer 412, and the redistribution metallic layer 412 is formed on the dielectric layer 428 and penetrates through the dielectric layer 428 to be electrically connected to the redistribution metallic layer 410. In this case, the dielectric layer 428 and the redistribution metallic layer 412 may be formed using the same methods and materials as the dielectric layer 422 and the redistribution metallic layer 414 described above, and the detailed description is thus omitted herein.

In some embodiments, a shortest distance between the metallic lines 412L of the redistribution metallic layer 412 and the semiconductor devices 100, 200 is determined by a sum of the thicknesses of the dielectric layer 420 and the dielectric layer 428. For example, the thickness of the dielectric layer 420 may range from about 2 micrometers to about 150 micrometers, and the thickness of the dielectric layer 428 may range from about 2 micrometers to about 100 micrometers.

FIG. 17 to FIG. 20 are schematic cross-sectional views illustrating a manufacturing process of a semiconductor package in accordance with some other embodiments of the disclosure. In some embodiments, the semiconductor package 30 may be manufactured by performing processes similar to the steps illustrated in FIG. 1 to FIG. 15 except the alteration of the steps of forming the redistribution structure RDL. That is, the steps illustrated in FIGS. 4-6 and FIGS. 9-16 may be replaced by the steps illustrated in FIG. 17 to FIG. 20.

Figure 17:
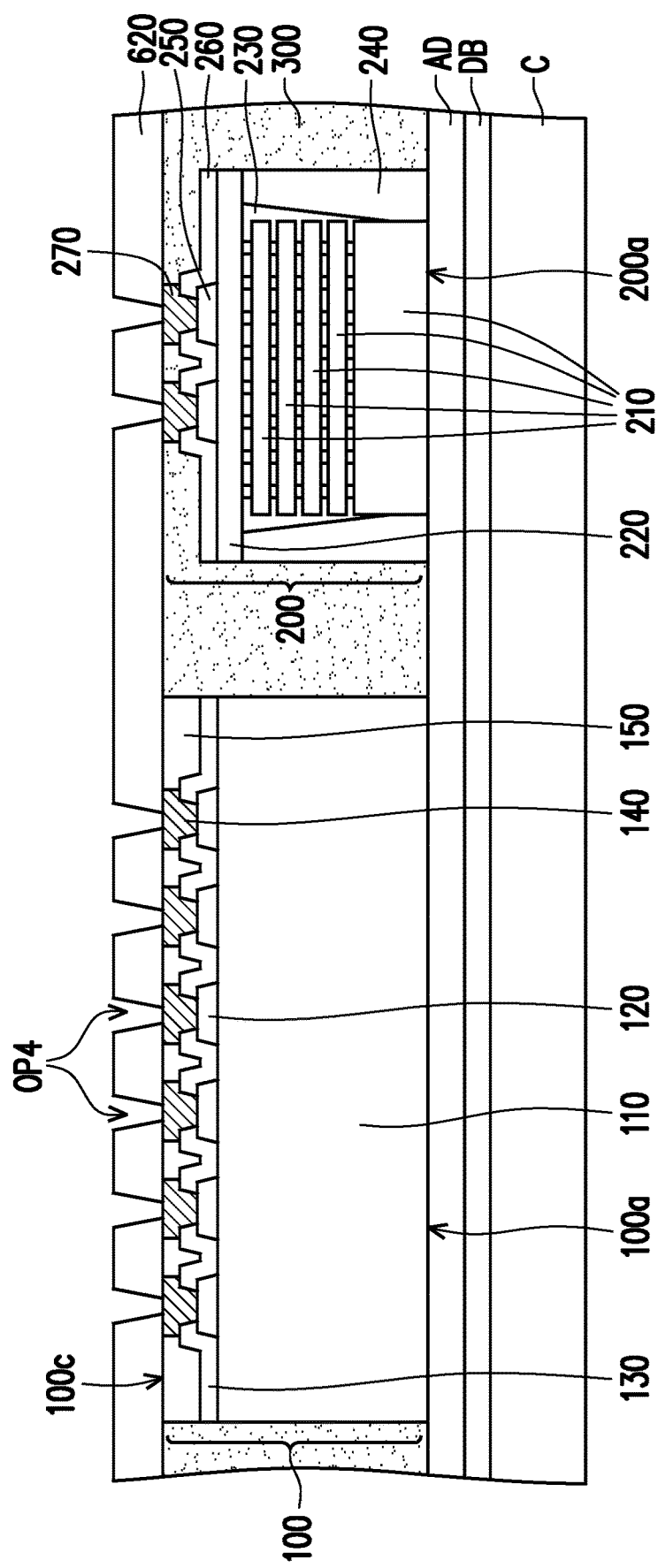
FIG. 17 to FIG. 20 are schematic cross-sectional views illustrating a manufacturing process of a semiconductor package in accordance with some other embodiments of the disclosure.

Referring to FIG. 17, the steps illustrated in FIG. 1 to FIG. 3 may be performed. Thereafter, a dielectric material layer (not shown) is formed over the insulating encapsulant 300, the first semiconductor device 100 and the second semiconductor device 200. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like.

Subsequently, the dielectric material layer is patterned to form a dielectric layer 620 having a plurality of openings OP4 for exposing portions of the vias 140 of the first semiconductor device 100 and the vias 270 of the second semiconductor device 200. In some embodiments, the dielectric material layer includes a photo-sensitive material which may be easily patterned by exposure and development processes. In alternative embodiments, the dielectric material layer is patterned by an etching process.

Figure 18:
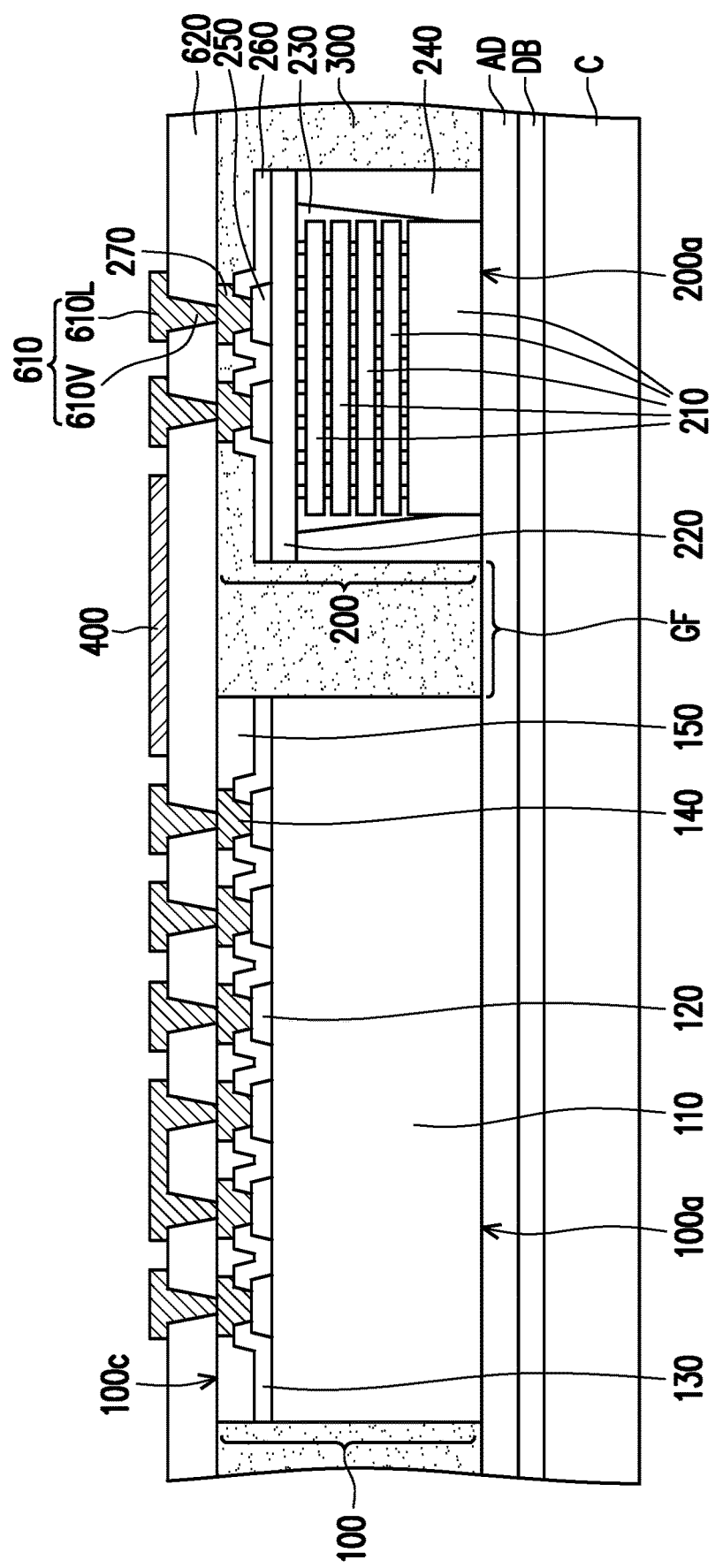

Referring to FIG. 17 and FIG. 18, a supporting element 400 and a redistribution metallic layer 610 is formed over the dielectric layer 620. In some embodiments, the method of forming the supporting element 400 and the redistribution metallic layer 610 includes the following steps. First, a seed material layer (not shown) is formed over the dielectric layer 620 and extends into the openings OP4 of the dielectric layer 620. The seed material layer may be similar to the aforementioned seed material layer S, so the detailed descriptions thereof are omitted herein. In some embodiments, the seed material layer is blanketly formed to be in direct contact with the dielectric layer 620, the vias 140 of the first semiconductor device 100 and the vias 270 of the second semiconductor device 200. Then, a photoresist layer (not shown) having a plurality of openings exposing at least a portion of the seed material layer is formed over the seed material layer. Then, a conductive material (not shown) is filled into the openings of the photoresist layer and the photoresist layer is removed, so as to form a plurality of conductive patterns on the seed material layer. Upon removal of the photoresist layer, portions of the seed material layer, which are not covered by the conductive patterns, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer may be removed/stripped through, for example, etching, ashing, or other suitable removal processes. Then, the seed material layer that is not covered by the conductive patterns is removed to render seed layers. The exposed portions of the seed material layer may be removed through an etching process. In some embodiments, the conductive patterns and the seed layers located on the vias 140 and the vias 270 are collectively referred to as a redistribution metallic layer 610. On the other hand, the conductive patterns and the seed layers located on the peripheral portions of the first semiconductor device 100 and the second semiconductor device 200 as well as the gap-filling portion GF of the insulating encapsulant 300 between the first semiconductor device 100 and the second semiconductor device 200 may be collectively referred to as the supporting element 400. In some embodiments, the redistribution metallic layer 610 includes metallic lines 610L on the dielectric layer 620 and metallic vias 610V penetrating through the dielectric layer 620 to be electrically connected to the first semiconductor device 100 and the second semiconductor device 200.

In some embodiments, the supporting element 400 and the redistribution metallic layer 610 are formed simultaneously, and the supporting element 400 is at a same level height as metallic lines 610L of the redistribution metallic layer 610. In some embodiments, the supporting element 400 is a metallic pattern. In some embodiments, the redistribution metallic layer 610 may electrically connect the vias 140 of the first semiconductor device 100 and/or the vias 270 of the second semiconductor device 200 with other subsequently formed elements. In some embodiments, the supporting element 400 is electrically floating. For example, the supporting element 400 is electrically insulated from the redistribution metallic layer 610, the vias 140 of the first semiconductor device 100, the vias 270 of the second semiconductor device 200, and the redistribution structure RDL. In some embodiments, the supporting element 400 is spaced apart from the first semiconductor device 100 and the insulating encapsulant 300 by the dielectric layer 620. In some embodiments, the supporting element 400 is spaced apart from the second semiconductor device 200 by the dielectric layer 620 and the insulating encapsulant 300. In some embodiments, some various top views of the supporting element 400 is similar to the supporting element 400 discussed in FIGS. 7A-7C, and FIGS. 8A-8B, so the detailed descriptions are not repeated for the sake of brevity.

Figure 19:
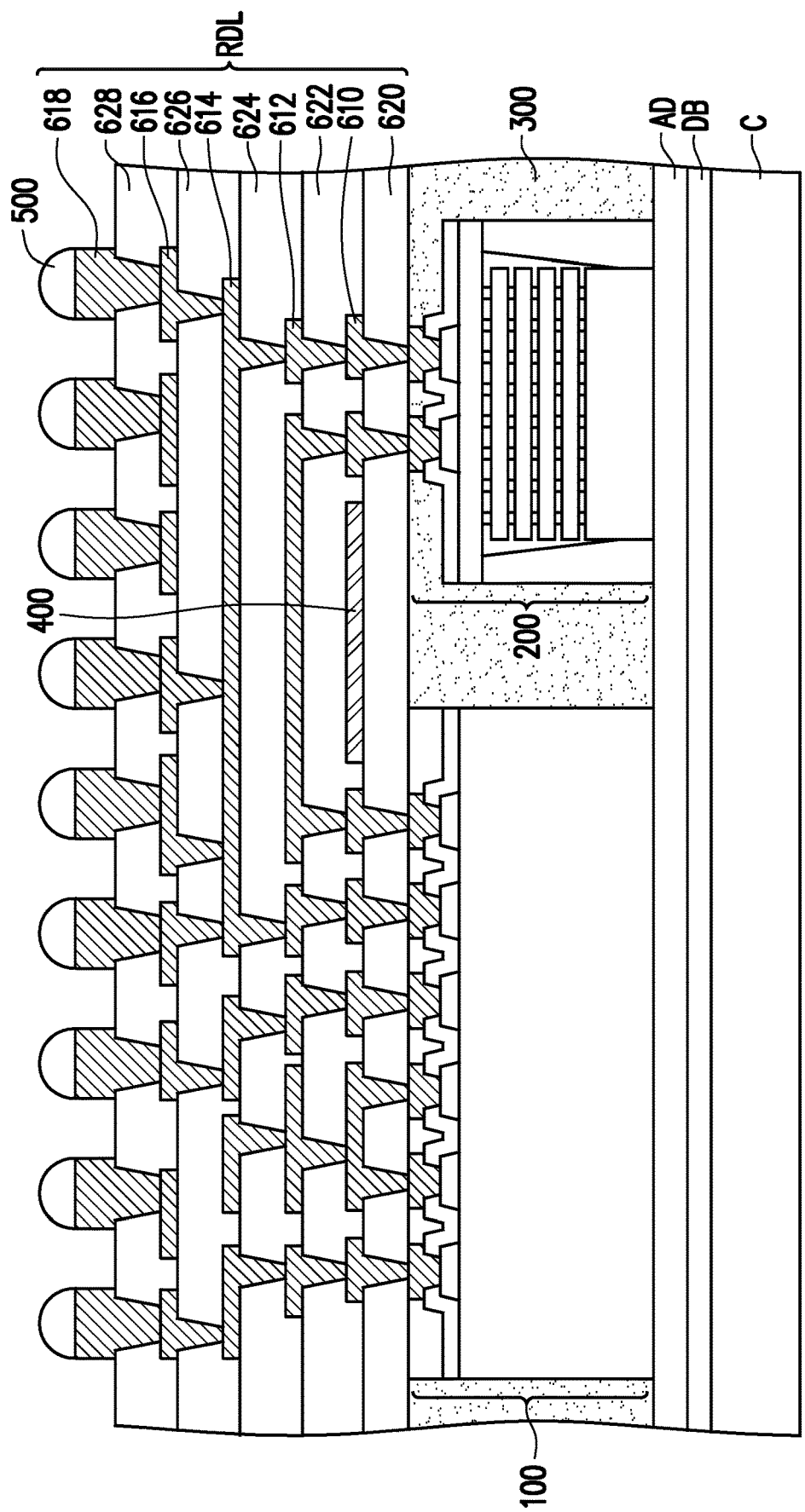

Referring to FIG. 19, a dielectric layer 622 is formed on the dielectric layer 620 and the redistribution metallic layer 610. A redistribution metallic layer 612 is formed on the dielectric layer 622 and penetrates through the dielectric layer 622 to be electrically connected to the redistribution metallic layer 610. A dielectric layer 624 is formed on the dielectric layer 622 and the redistribution metallic layer 612. A redistribution metallic layer 614 is formed on the dielectric layer 624 and penetrates through the dielectric layer 624 to be electrically connected to the redistribution metallic layer 612. A dielectric layer 626 is formed on the dielectric layer 624 and the redistribution metallic layer 614. A redistribution metallic layer 616 is formed on the dielectric layer 626 and penetrates through the dielectric layer 626 to be electrically connected to the redistribution metallic layer 614. A dielectric layer 628 is formed on the dielectric layer 626 and the redistribution metallic layer 616. A redistribution metallic layer 618 is formed on the dielectric layer 628 and penetrates through the dielectric layer 628 to be electrically connected to the redistribution metallic layer 616. In some embodiments, the dielectric layer 622, 624, 626 and 628 and the redistribution metallic layer 612, 614, 616 and 618 may be formed using the same methods and materials as the dielectric layer 422 and the redistribution metallic layer 414 described in FIG. 11 and FIG. 12, and the detailed description is thus omitted herein.

In some embodiments, the topmost one of the redistribution metallic layers (e.g., redistribution metallic layer 618) includes a part (e.g., under-ball metallurgy (UBM) patterns) for electrically connecting with the later-formed components. In some embodiments, after the redistribution structure RDL is formed, a plurality of conductive terminals 500 are formed on the UBM patterns of the redistribution metallic layer 618 by a ball placement process, a plating process, or other suitable processes. The conductive terminals 500 may be similar to the conductive terminals 500 described in FIG. 13, so the detailed descriptions thereof are omitted herein.

Figure 20:
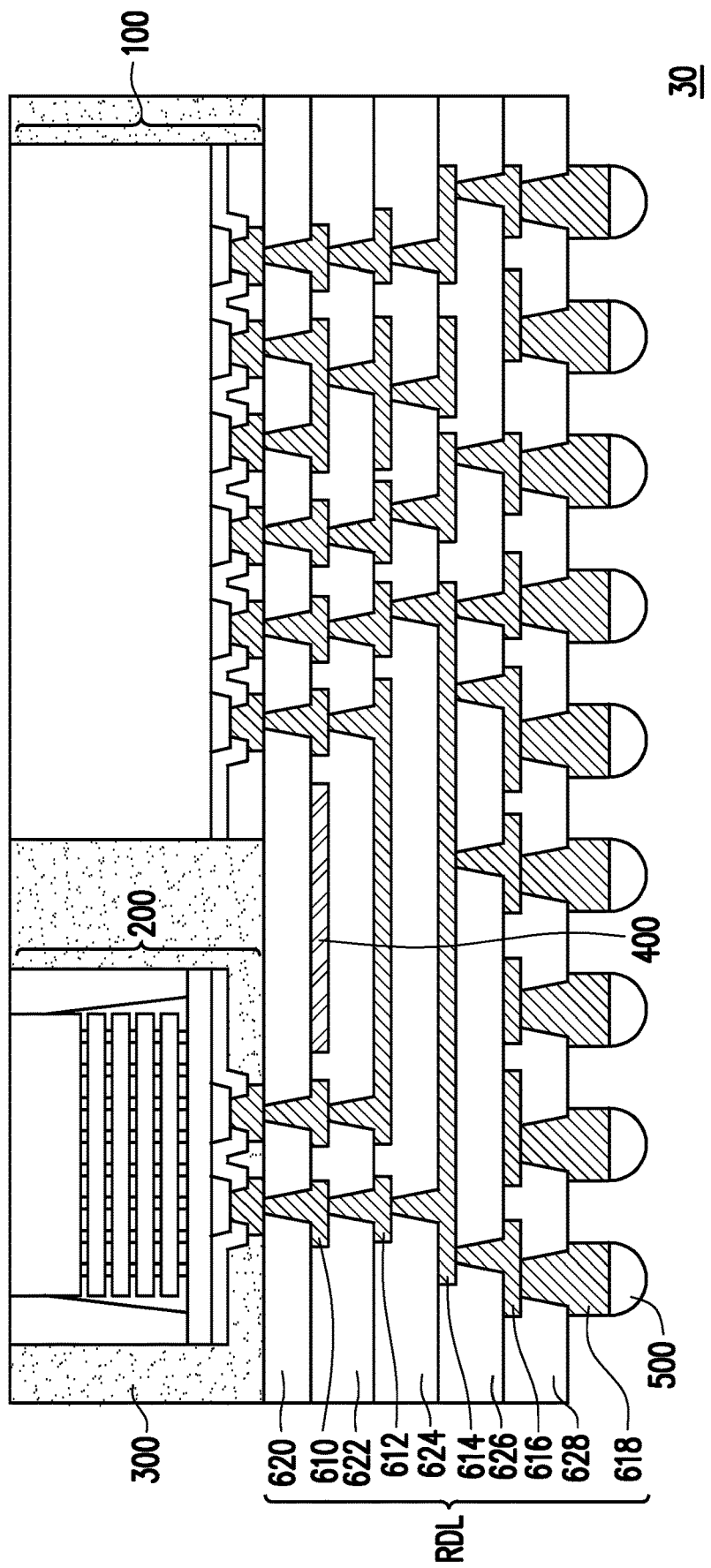

Referring to FIG. 20, the process similar to the steps shown in FIG. 14 to FIG. 15 may be repeated to obtain the semiconductor package 30. As illustrated in FIG. 20, the semiconductor package 30 includes the first semiconductor device 100 and the second semiconductor device 200 laterally encapsulated by the insulating encapsulant 300. The redistribution structure RDL is disposed on the first semiconductor device 100, the second semiconductor device 200 and the insulating encapsulant 300, and is electrically connected to the first semiconductor device 100 and the second semiconductor device 200, wherein the supporting element (or a buffer pattern) 400 is embedded in the redistribution structure RDL, and is spaced apart from the first semiconductor device 100 and the insulating encapsulant 300. It is noted that, in some alternative embodiments, the supporting element 400 may be embedded in another dielectric layer of the redistribution structure RDL, such as the dielectric layer furthest away from the semiconductor devices 100, 200. The disclosure is not limited thereto.

Figure 21:
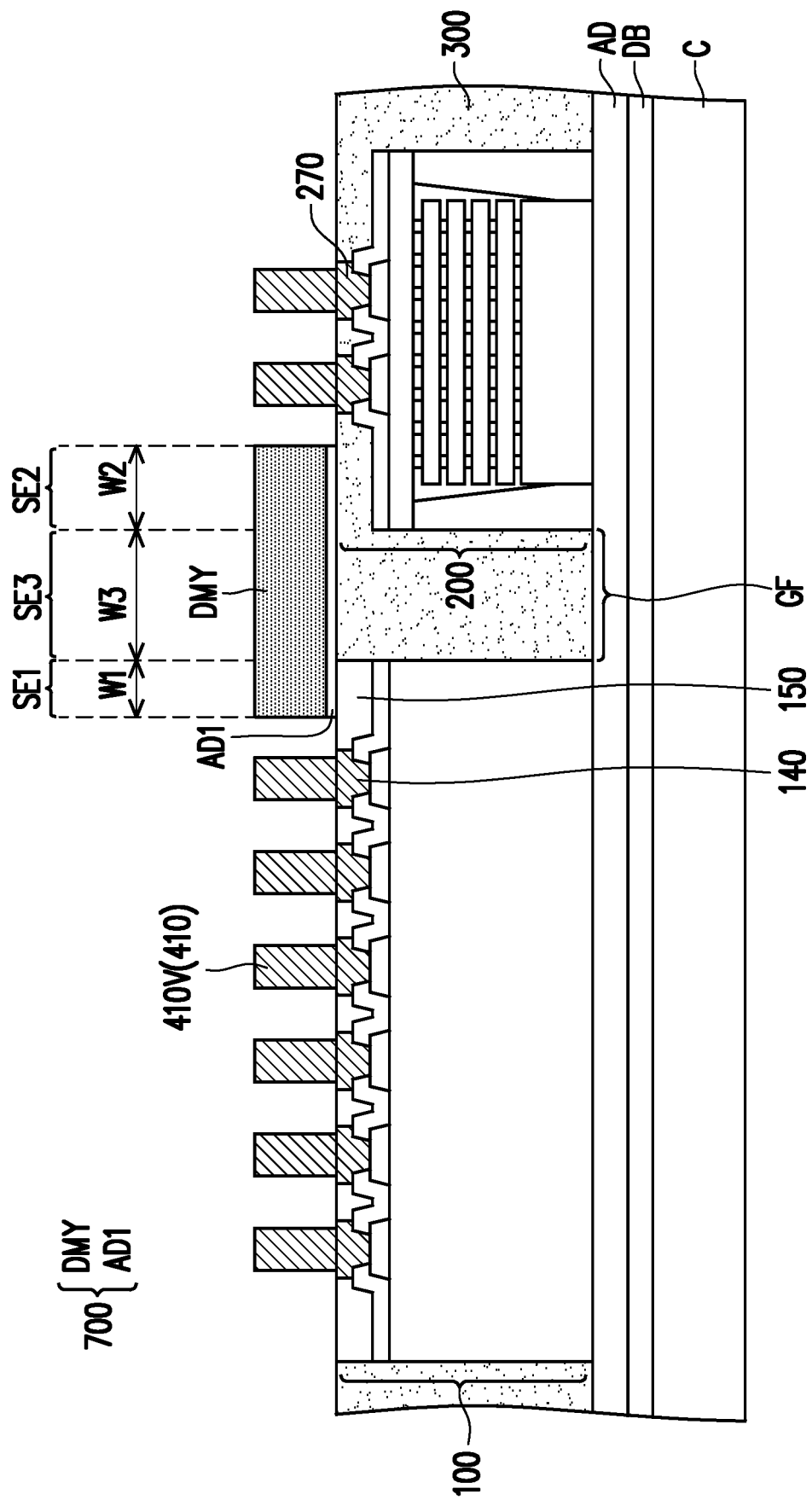
FIG. 21 to FIG. 23 are schematic cross-sectional views illustrating a manufacturing process of a semiconductor package in accordance with some other embodiments of the disclosure.
Figure 22:
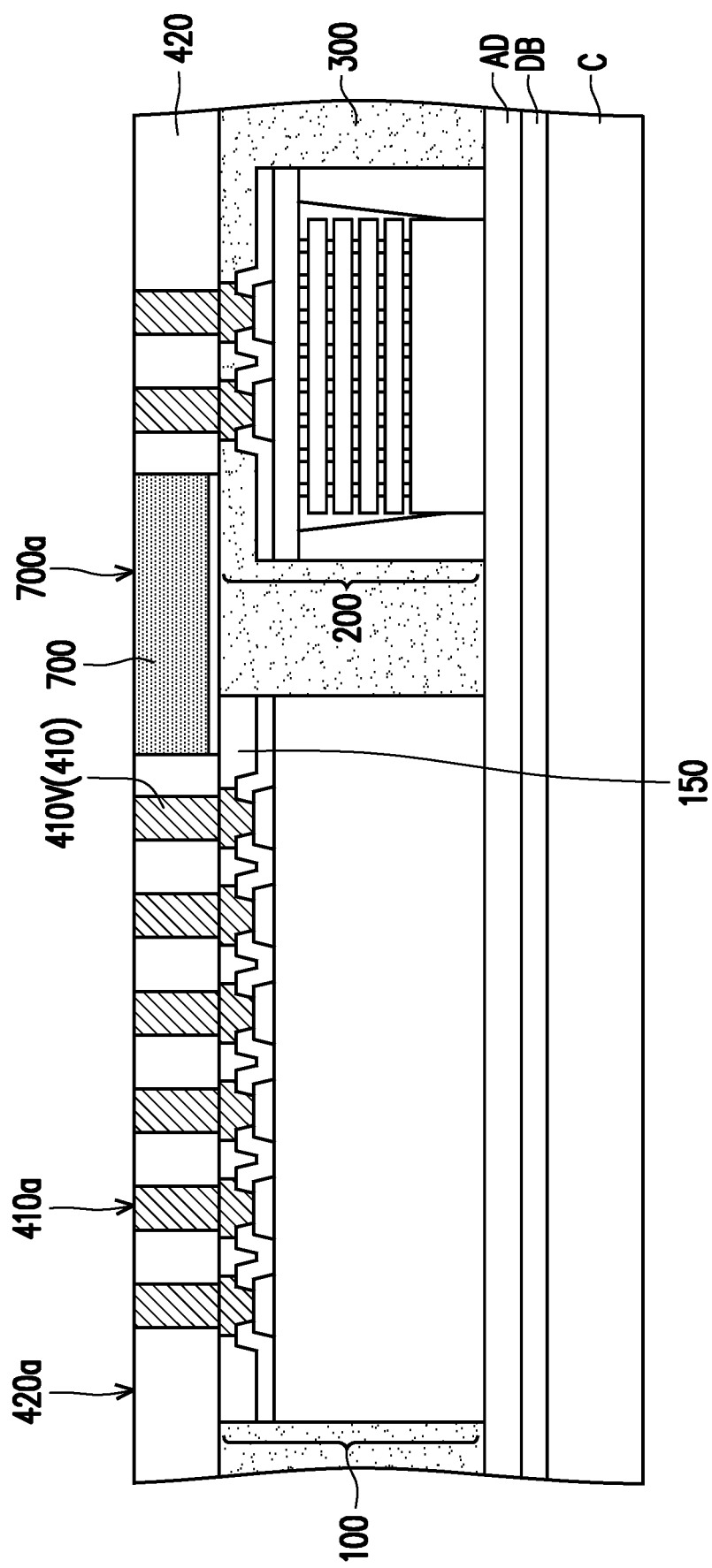
Figure 23:
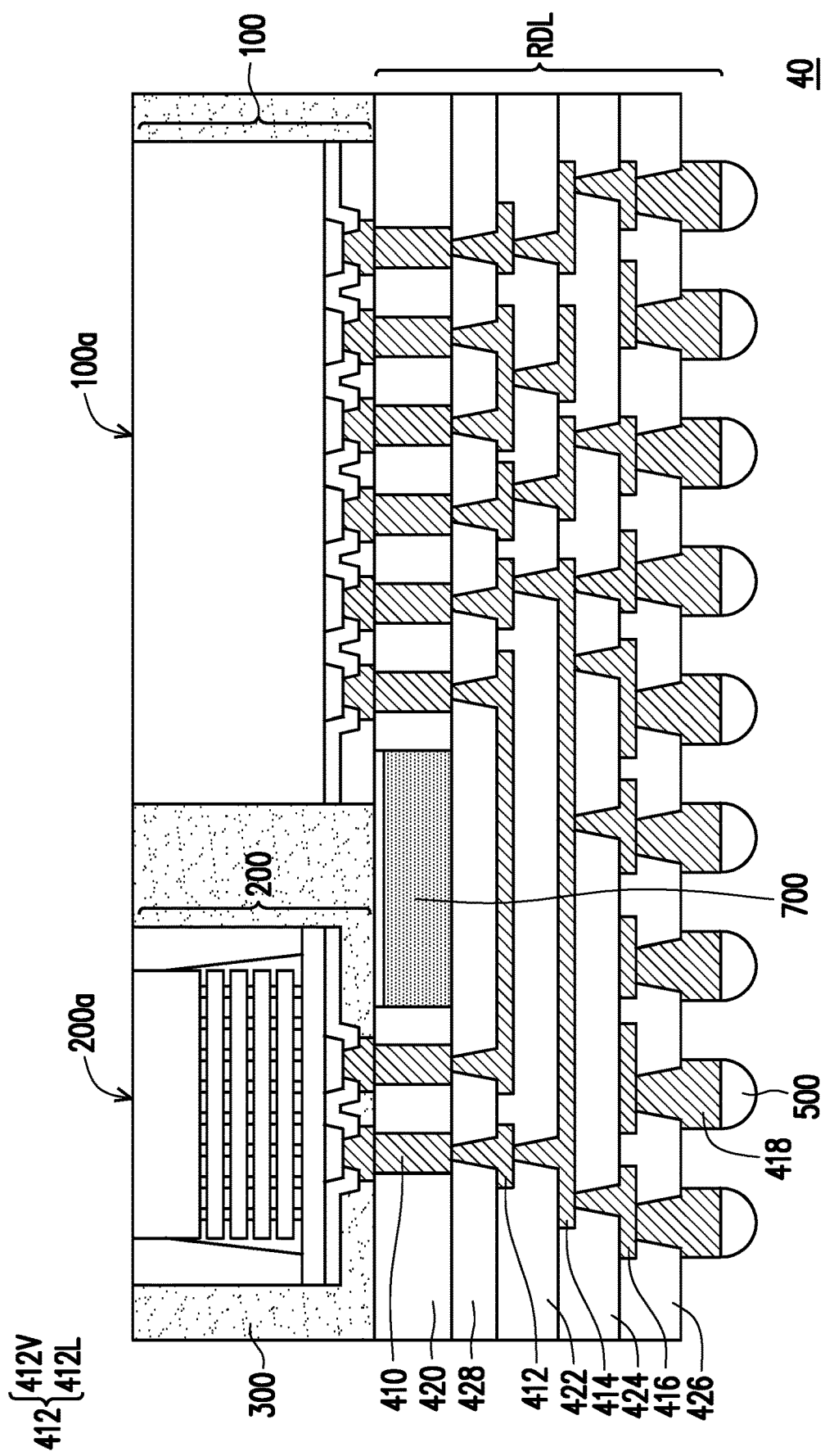

FIG. 21 to FIG. 23 are schematic cross-sectional views illustrating a manufacturing process of a semiconductor package in accordance with some other embodiments of the disclosure. In some embodiments, the semiconductor package 40 may be manufactured by performing processes similar to the steps illustrated in FIG. 1 to FIG. 15 except the alteration of the steps of forming the redistribution structure RDL. That is, the steps illustrated in FIGS. 4-6 and FIGS. 9-16 may be replaced by the steps illustrated in FIG. 21 to FIG. 23.

Referring to FIG. 21, the steps illustrated in FIG. 1 to FIG. 3 may be performed. Thereafter, the steps illustrated in FIG. 4 to FIG. 6 may be performed, expect that the photoresist layer PR1 does not have the at least one opening OP2. That is to say, only the metallic vias 410V of the redistribution metallic layer 410 are formed. Then, at least one supporting element 700 is provided through a pick and place process. In some embodiments, the at least one supporting element 700 includes a semiconductor dummy pattern DMY and an adhesive layer AD1. The semiconductor dummy pattern DMY is attached (or adhered) to a gap-filling portion GF of the insulating encapsulant 300 between the first semiconductor device 100 and the second semiconductor device 200 through the adhesive layer AD1. In some embodiments, the semiconductor dummy pattern DMY includes a dummy silicon pattern which does not have circuits formed therein. In some embodiments, the adhesive layer AD1 includes a die attach film (DAF).

As illustrated in FIG. 21, the metallic vias 410V are located on the vias 140 and the vias 270, and the supporting element 700 is located between the metallic vias 410V on the vias 140 and the metallic vias 410V on the vias 270. In some embodiments, the metallic vias 410V of the redistribution metallic layer 410 may electrically connect the vias 140 of the first semiconductor device 100 and/or the vias 270 of the second semiconductor device 200 with other subsequently formed elements. In some embodiments, the supporting element 700 is electrically floating. For example, the supporting element 700 is electrically insulated from the metallic vias 410V of the redistribution metallic layer 410, the vias 140 of the first semiconductor device 100, the vias 270 of the second semiconductor device 200, and the redistribution structure RDL. In some embodiments, the supporting element 700 is in physical contact with the insulating encapsulant 300 and the protection layer 150 of the first semiconductor device 100. In some embodiments, the supporting element 400 is spaced apart from the second semiconductor device 200 by the insulating encapsulant 300. In some embodiments, some various top views of the supporting element 700 is similar to the supporting element 400 discussed in FIGS. 8A-8B, so the detailed descriptions are not repeated for the sake of brevity.

Referring to FIG. 22, a dielectric material layer (not shown) is formed over the insulating encapsulant 300, the first semiconductor device 100 and the second semiconductor device 200 to encapsulate the metallic vias 410V of the redistribution metallic layer 410 and the at least one supporting element 700. In other words, the metallic vias 410V of the redistribution metallic layer 410 and the at least one supporting element 700 are not revealed and are well protected by the dielectric material layer. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Subsequently, a portion of the dielectric material layer is removed to form a dielectric layer 420 exposing top surfaces 410a of the metallic vias 410V and a top surface 700a of the supporting element 700. For example, the dielectric material layer may be planarized until top surfaces 410a of the metallic vias 410V and the top surface 700a of the supporting element 700 are exposed. In some embodiments, the dielectric material layer is planarized by a chemical mechanical polishing (CMP) process. In some embodiments, portions of the metallic vias 410V and the semiconductor dummy pattern DMY are slightly grinded as well. It is noted that the top surfaces 410a of the metallic vias 410V and the top surface 700a of the supporting element 700 are substantially coplanar with a top surface 420a of the dielectric layer 420. In some alternative embodiments, the top surface 700a of the supporting element 700 may be lower or higher than the top surface 420a of the dielectric layer 420.

Referring to FIG. 23, the process similar to the steps shown in FIG. 11 to FIG. 15 may be repeated to obtain the semiconductor package 40. The semiconductor package 40 is similar to the semiconductor package 20 in FIG. 16, except the supporting element 400 is replaced by the supporting element 700. As illustrated in FIG. 23, the semiconductor package 40 includes the first semiconductor device 100 and the second semiconductor device 200 laterally encapsulated by the insulating encapsulant 300. The redistribution structure RDL is disposed on the first semiconductor device 100, the second semiconductor device 200 and the insulating encapsulant 300, and is electrically connected to the first semiconductor device 100 and the second semiconductor device 200, wherein the supporting element (or a buffer pattern) 700 is embedded in the redistribution structure RDL, and the supporting element 700 is in contact with the first semiconductor device 100 and the insulating encapsulant 300.

Figure 24:
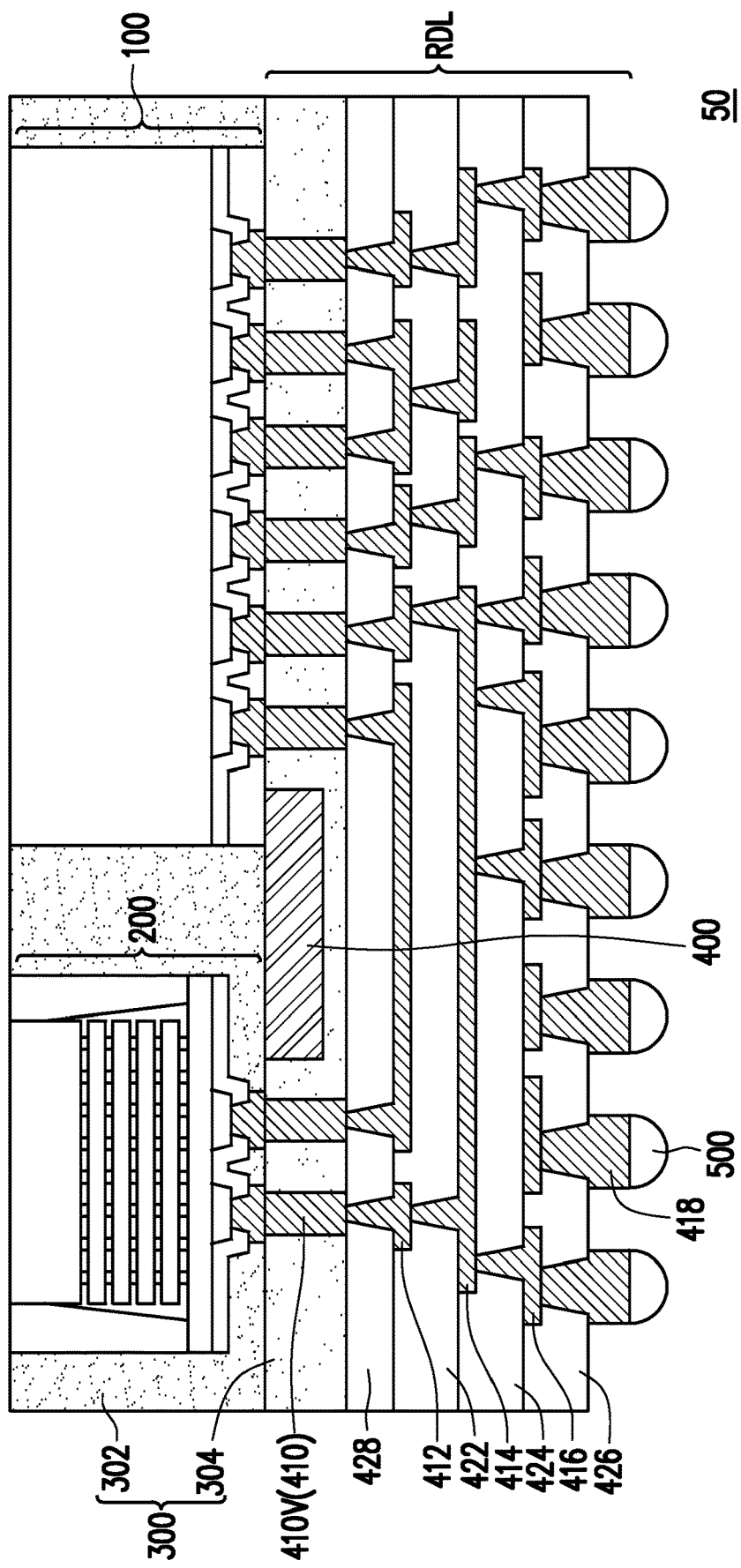
FIG. 24 to FIG. 26 are schematic cross-sectional views illustrating a semiconductor package in accordance with some other embodiments of the disclosure.
Figure 25:
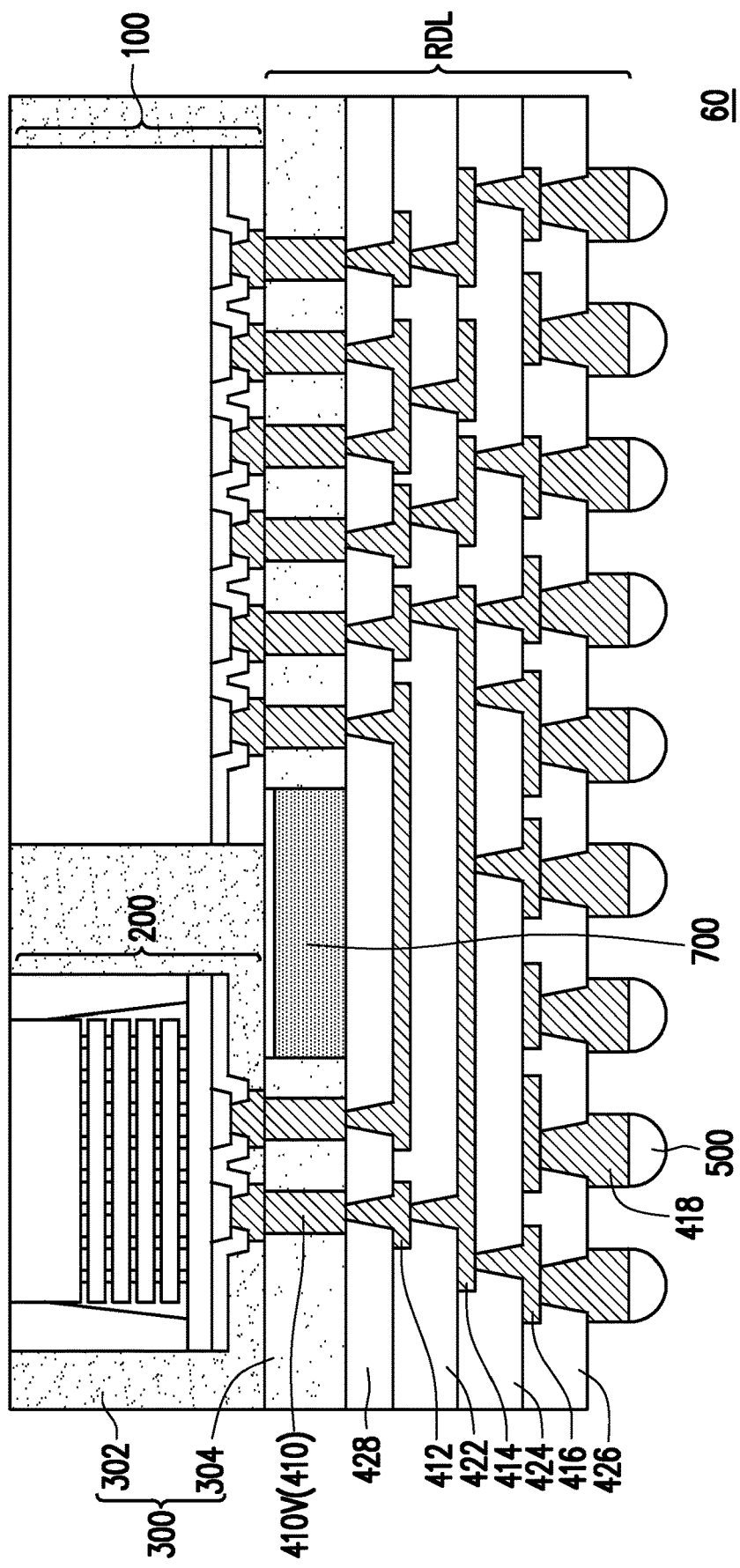
Figure 26:
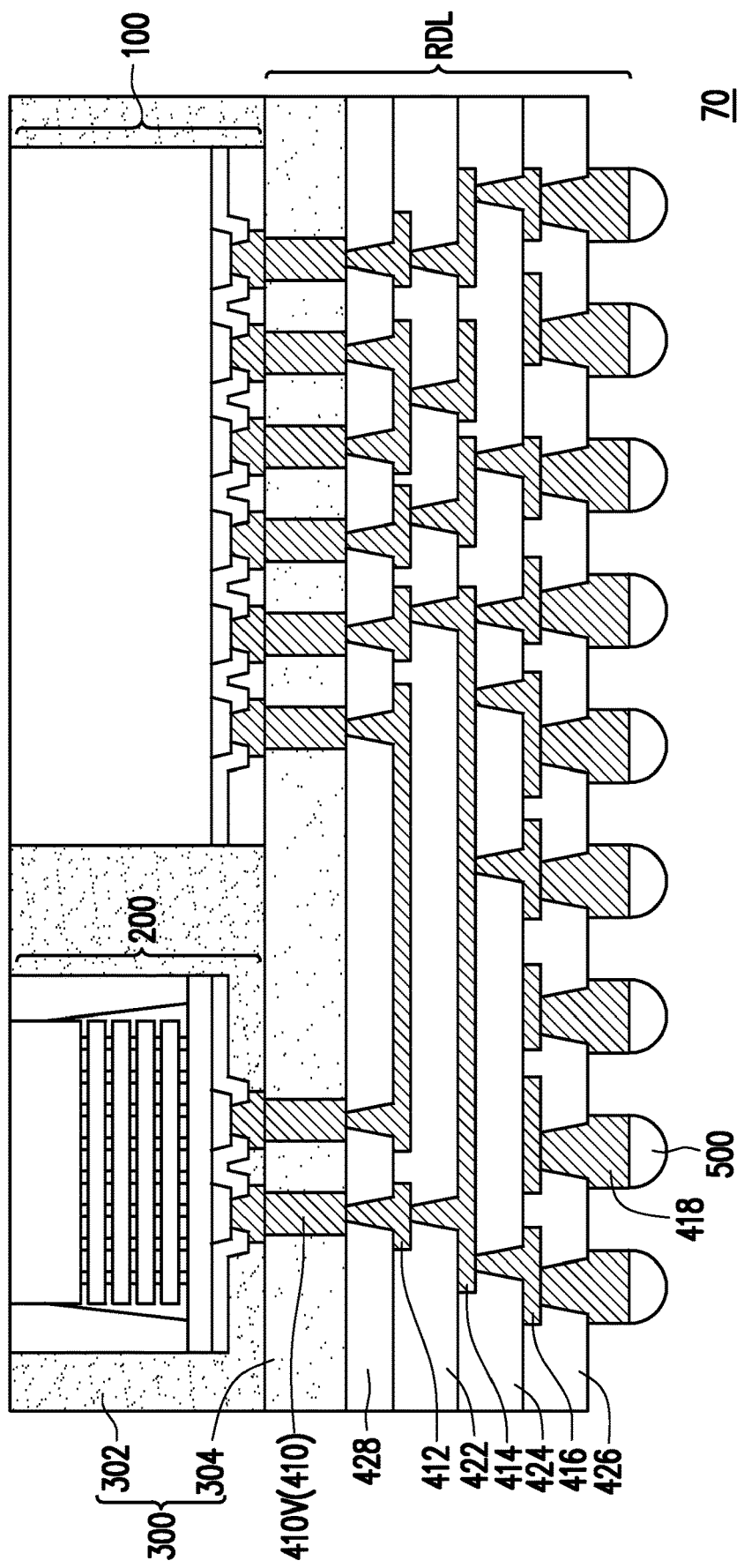

FIG. 24 to FIG. 26 are schematic cross-sectional views illustrating a semiconductor package in accordance with some other embodiments of the disclosure.

Referring to FIG. 24 and FIG. 25, the semiconductor package 50 is similar to the semiconductor package 20 illustrated in FIG. 16, and the semiconductor package 60 is similar to the semiconductor package 40 illustrated in FIG. 23, except that the dielectric layer 420 is replaced by an insulating encapsulant. In detail, the insulating encapsulant 300 includes a first portion 302 and a second portion 304. The first portion 302 of the insulating encapsulant 300 laterally encapsulates the first semiconductor device 100 and the second semiconductor device 200, the second portion 304 of the insulating encapsulant 300 is located on the first portion 302 of the insulating encapsulant 300, the first semiconductor device 100 and the second semiconductor device 200, and the supporting element (i.e., the supporting element 400 in FIG. 24, and the supporting element 700 in FIG. 25) is embedded in the second portion 304 of the insulating encapsulant 300.

In some embodiments, after the supporting element (i.e., the supporting element 400 in FIG. 24, and the supporting element 700 in FIG. 25) and the redistribution metallic layer 410 are formed, and before the dielectric layer 428 is formed, an encapsulation material is formed over the first portion 302 of the insulating encapsulant 300 to encapsulate the supporting element (i.e., the supporting element 400 in FIG. 24, and the supporting element 700 in FIG. 25) and the redistribution metallic layer 410. In some embodiments, the encapsulation material is a molding compound, a molding underfill, a resin (such as epoxy), or the like. The encapsulation material may be formed by a molding process. For example, the encapsulation material may be formed by a compression molding process, a transfer molding process, or the like. A curing process is optionally performed to harden the encapsulation material for optimum protection. In some embodiments, the encapsulation material includes a base material and filler particles distributed in the base material. In some embodiments, the material of the base material includes epoxy resins, phenolic resins or silicon-containing resins, or the like, and the material of the filler particles includes silica, alumina, zinc oxide, titanium dioxide, or the like. Subsequently, a portion of the encapsulation material is removed to form the second portion 304 of the insulating encapsulant 300 exposing top surfaces 410a of the metallic vias 410V. In some embodiments, the encapsulation material is planarized by a chemical mechanical polishing (CMP) process.

In some embodiments, the materials of the first portion 302 and the second portion 304 of the insulating encapsulant 300 are the same. In some embodiments, the materials of the first portion 302 and the second portion 304 of the insulating encapsulant 300 are different. In some embodiments, since the first portion 302 of the insulating encapsulant 300 has been planarized, some filler particles in an upper portion of the base material may be removed (polished or grinded) partially, causing some of the filler particles to have the top portions removed, and bottom portions remained in the base material. As a result, the filler particles that are planarized or grinded may have partial spherical shapes, and hence the interface between first portion 302 and the second portion 304 of the insulating encapsulant 300 is distinguishable, regardless of the materials of the encapsulation material.

As illustrated in FIG. 24, the semiconductor package 40 includes the first semiconductor device 100 and the second semiconductor device 200 laterally encapsulated by the first insulating encapsulant 302. The second insulating encapsulant 304 is disposed on the first semiconductor device 100, the second semiconductor device 200 and the first insulating encapsulant 302, and the second insulating encapsulant 304 is in contact with the first insulating encapsulant 302. The redistribution structure RDL is disposed on the second insulating encapsulant 304, and includes the metallic vias 410V penetrating through the second insulating encapsulant 304 to be electrically connected to the first semiconductor device 100 and the second semiconductor device 200. The supporting element (or a buffer pattern) 400 is embedded in the second insulating encapsulant 304, and a height of the supporting element 400 is less than that of the plurality of metallic vias 410V.

As illustrated in FIG. 25, the semiconductor package 50 includes the first semiconductor device 100 and the second semiconductor device 200 laterally encapsulated by the first insulating encapsulant 302. The second insulating encapsulant 304 is disposed on the first semiconductor device 100, the second semiconductor device 200 and the first insulating encapsulant 302, and the second insulating encapsulant 304 is in contact with the first insulating encapsulant 302. The redistribution structure RDL is disposed on the second insulating encapsulant 304, and includes the metallic vias 410V penetrating through the second insulating encapsulant 304 to be electrically connected to the first semiconductor device 100 and the second semiconductor device 200. The supporting element (or a buffer pattern) 700 penetrates through the second insulating encapsulant 304.

Referring to FIG. 26, the semiconductor package 70 is similar to the semiconductor package 50 illustrated in FIG. 24 or the semiconductor package 60 illustrated in FIG. 25, except that the supporting element 400 or the supporting element 700 is omitted, so the detailed descriptions are not repeated for the sake of brevity.

In some embodiments, since the second insulating encapsulant 304 may have a higher hardness than the dielectric material, the second insulating encapsulant 304 may also serve as a buffer between the encapsulated semiconductor devices 100, 200 and the redistribution structure RDL to reduce and absorb stress which is caused by coefficient of thermal expansion (CTE) mismatch between different materials. The second insulating encapsulant 304 may prevent the metallic lines of the redistribution structure RDL from being opened induced by the delamination of the first insulating encapsulant 302 from the semiconductor devices 100, 200. Accordingly, the reliability of the redistribution structure RDL may be improved.

In accordance with some embodiments of the disclosure, a semiconductor package includes a first semiconductor device, a second semiconductor device, an insulating encapsulant, a redistribution structure and a supporting element. The insulating encapsulant encapsulates the first semiconductor device and the second semiconductor device. The redistribution structure is over the first semiconductor device, the second semiconductor device and the insulating encapsulant. The redistribution structure is electrically connected to the first semiconductor device and the second semiconductor device. The supporting element is embedded in one of the insulating encapsulant and the redistribution structure.

In accordance with some embodiments of the disclosure, a semiconductor package includes a first semiconductor device, a second semiconductor device, an insulating encapsulant, a redistribution structure and a buffer pattern. The insulating encapsulant encapsulates the first semiconductor device and the second semiconductor device, and separates the first semiconductor device from the second semiconductor device. The buffer pattern is embedded in one of the insulating encapsulant and the redistribution structure, wherein the buffer pattern includes a first segment overlapping a portion of the first semiconductor device, a second segment overlapping a portion of the second semiconductor device, and a third segment connected between the first segment and the second segment.

In accordance with some embodiments of the disclosure, a semiconductor package includes a first semiconductor device, a second semiconductor device, a first insulating encapsulant, a second insulating encapsulant and a redistribution structure. The first insulating encapsulant laterally encapsulates the first semiconductor device and the second semiconductor device. The second insulating encapsulant is over the first semiconductor device, the second semiconductor device and the first insulating encapsulant. The redistribution structure is over the second insulating encapsulant, wherein the redistribution structure includes a plurality of metallic vias penetrating through the second insulating encapsulant to be electrically connected to the first semiconductor device and the second semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a first semiconductor device and a second semiconductor device;
an insulating encapsulant, encapsulating the first semiconductor device and the second semiconductor device;
a redistribution structure, over the first semiconductor device, the second semiconductor device and the insulating encapsulant, the redistribution structure electrically connected to the first semiconductor device and the second semiconductor device; and
a supporting element, embedded in one of the insulating encapsulant and the redistribution structure, wherein portions of the support element overlap a portion of the first semiconductor device and a portion of the second semiconductor device.

2. The semiconductor package as claimed in claim 1, wherein the insulating encapsulant comprises a first portion and a second portion, the first portion of the insulating encapsulant laterally encapsulates the first semiconductor device and the second semiconductor device, the second portion of the insulating encapsulant is located on the first portion of the insulating encapsulant, the first semiconductor device and the second semiconductor device, and the supporting element is embedded in the second portion of the insulating encapsulant.

3. The semiconductor package as claimed in claim 1, wherein the supporting element comprises a semiconductor dummy pattern.

4. The semiconductor package as claimed in claim 1, wherein the supporting element comprises a metallic pattern.

5. The semiconductor package as claimed in claim 4, wherein the redistribution structure comprises a plurality of dielectric layers and a plurality of redistribution metallic layers stacked alternately, and the metallic pattern is at a same level height as metallic vias or metallic lines of one redistribution metallic layer among the plurality of redistribution metallic layers.

6. The semiconductor package as claimed in claim 1, wherein the supporting element is in contact with the insulating encapsulant.

7. The semiconductor package as claimed in claim 1, wherein the redistribution structure comprises a plurality of dielectric layers stacked alternately, and the supporting element is spaced apart from the insulating encapsulant by at least one dielectric layer among the plurality of dielectric layers.

8. The semiconductor package as claimed in claim 1, wherein the supporting element is electrically floating.

9. The semiconductor package as claimed in claim 1, wherein the first semiconductor device comprises a semiconductor die, and the second semiconductor device comprises a package.

10. A semiconductor package, comprising:
a first semiconductor device and a second semiconductor device;
an insulating encapsulant, encapsulating the first semiconductor device and the second semiconductor device, and separating the first semiconductor device from the second semiconductor device;
a redistribution structure, over the first semiconductor device, the second semiconductor device and the insulating encapsulant, the redistribution structure electrically connected to the first semiconductor device and the second semiconductor device; and
a buffer pattern, embedded in one of the insulating encapsulant and the redistribution structure, wherein the buffer pattern comprises a first segment overlapping a portion of the first semiconductor device, a second segment overlapping a portion of the second semiconductor device, and a third segment connected between the first segment and the second segment.

11. The semiconductor package as claimed in claim 10, wherein the insulating encapsulant comprises a first portion and a second portion, the first portion of the insulating encapsulant laterally encapsulates the first semiconductor device and the second semiconductor device, the second portion of the insulating encapsulant is located on the first portion of the insulating encapsulant, the first semiconductor device and the second semiconductor device, and the supporting element is embedded in the second portion of the insulating encapsulant.

12. The semiconductor package as claimed in claim 10, wherein the supporting element comprises a semiconductor dummy pattern.

13. The semiconductor package as claimed in claim 10, wherein the supporting element comprises a metallic pattern.

14. The semiconductor package as claimed in claim 13, wherein the redistribution structure comprises a plurality of dielectric layers and a plurality of redistribution metallic layers stacked alternately, and the metallic pattern is at a same level height as metallic vias or metallic lines of one redistribution metallic layer among the plurality of redistribution metallic layers.

15. The semiconductor package as claimed in claim 14, wherein the metallic pattern is at the same level height as the metallic vias of the one redistribution metallic layer among the plurality of redistribution metallic layers, and a height of the metallic pattern is less than that of the metallic vias of the one redistribution metallic layer among the plurality of redistribution metallic layers.

16. The semiconductor package as claimed in claim 10, wherein the buffer pattern is electrically floating.

17. A semiconductor package, comprising:
a first semiconductor device and a second semiconductor device;
a first insulating encapsulant, laterally encapsulating the first semiconductor device and the second semiconductor device;
a second insulating encapsulant, over the first semiconductor device, the second semiconductor device and the first insulating encapsulant;
a redistribution structure, over the second insulating encapsulant, wherein the redistribution structure comprises a plurality of metallic vias penetrating through the second insulating encapsulant to be electrically connected to the first semiconductor device and the second semiconductor device; and
a buffer pattern embedded in the second insulating encapsulant.

18. The semiconductor package as claimed in claim 17, wherein the second insulating encapsulant is in contact with the first insulating encapsulant.

19. The semiconductor package as claimed in claim 17, wherein the buffer pattern penetrates through the second insulating encapsulant.

20. The semiconductor package as claimed in claim 17, wherein a height of the buffer pattern is less than that of the plurality of metallic vias.

* * * * *